United States Patent [19]

Pike et al.

[11] Patent Number: 4,949,290

[45] Date of Patent: Aug. 14, 1990

[54] METHOD AND APPARATUS FOR DEFINING TEST SEQUENCES FOR A SIGNAL MEASUREMENT SYSTEM

[75] Inventors: William T. Pike; Robert T. Loder, Jr., both of Santa Rosa, Calif.

[73] Assignee: Hewlett-Packard Company, Palo Alto, Calif.

[21] Appl. No.: 178,036

[22] Filed: Apr. 5, 1988

[51] Int. Cl.⁵ .................... G06F 15/20; G01R 23/16
[52] U.S. Cl. .................... 364/580; 324/76 R; 324/77 B; 364/481; 364/485; 364/550
[58] Field of Search ............... 364/146, 191, 710.07, 364/709.14, 580, 480, 481, 483, 485, 550, 487; 371/20; 324/73 R, 73 PC, 76 R, 77 B

[56] References Cited

U.S. PATENT DOCUMENTS

| | | | |
|---|---|---|---|
| 4,145,742 | 3/1979 | Olander, Jr. et al. | 364/709.14 |
| 4,207,611 | 6/1980 | Gordon | 364/580 |
| 4,455,618 | 6/1984 | Walden et al. | 364/709.14 |
| 4,456,964 | 6/1984 | Olander, Jr. et al. | 364/710.07 |
| 4,550,406 | 10/1985 | Neal | 364/300 |
| 4,606,025 | 8/1986 | Peters et al. | 371/20 |
| 4,636,717 | 1/1987 | Sharrit et al. | 364/485 |
| 4,682,158 | 7/1987 | Ito et al. | 364/146 |
| 4,750,105 | 6/1988 | Ohkawa et al. | 364/191 |
| 4,763,117 | 8/1988 | Battner et al. | 364/481 |

OTHER PUBLICATIONS

IEEE Computer, Sep. 1984, "The Knowledge-Based Expert System: A Tutorial", F. Hayes-Roth, pp. 11-28.
Wavetek, 1985, "Peak RF and Microwave Power Measurements", Application Note #AN26.
Metrabyte, Winter 1985/86 Catalog, "Data Acquisition and Control Software . . . ", pp. 66-68.

*Primary Examiner*—Kevin J. Teska
*Attorney, Agent, or Firm*—William C. Milks, III

[57] ABSTRACT

A signal measurement system with softkey menus for enabling a user to select a desired test setup, including selection of test measurement for a device. The signal measurement system prompts the user with a set of displayed softkey selections via a user interface to step the user through the setup process. Preferably, a signal processing unit (or analyzer) included in the signal measurement system incorporates the user interface in firmware to aid the user in entering a test sequence for the device to be tested. The analyzer preferably displays the softkey menus on a cathode ray tube included in the analyzer to guide the user. The user is guided through the test sequencing procedure by depressing softkeys. A set of softkey labels (softkey menu) is presented on the display of the analyzer by the firmware for each step in the test sequencing series. As each step of a desired test sequence is entered by the user, the step is displayed on the CRT. Also, the displayed steps are preferably overlaid on data measured in accordance with the test sequence.

14 Claims, 4 Drawing Sheets

METHOD AND APPARATUS FOR DEFINING TEST SEQUENCES FOR A SIGNAL MEASUREMENT SYSTEM

BACKGROUND OF THE INVENTION

This invention relates to electronic test instruments and, more particularly, to electronic instrumentation for signal measurements during tests performed on radio frequency (RF) and microwave systems and associated components. Specifically, the invention is directed to a method and apparatus for aiding a user to define a test sequence for configuring electronic test instruments for measuring various characteristics of RF and microwave systems and associated components being tested in response to swept frequency stimuli applied by either an internal or external signal source.

Traditionally, many signal measurement systems, such as vector network analyzers, are perceived as products for research and development engineers. However, the manufacturer is faced with finding a reasonable solution to tests on RF and microwave systems and associated components that balances low cost with performance sufficient for production test needs. There are few, if any, economy vector network analyzers designed specifically to meet the production test needs of the system or component manufacturer.

Furthermore, the need for simple control of test instruments is increasing as the test instrumentation becomes more complex. In the case of many vector network analyzers, there is an RF source, a receiver, and a display. These can be configured to make system or component measurements at different frequencies, powers, and speeds. These vector network analyzers can measure different channels with different inputs, and they can display the results in a variety of formats.

Many different attempts at simplifying repetitive measurements have been tried (ASP, that is, Auto Sequence Programming, as described in HP 4194A ASP Programming Guide, Hewlett-Packard Company Part #5920-2915 and BASIC from Anritsu Corporation and Avantest Corporation). These implementations involve a programming language and do not allow a user to control his or her instrument while setting up a measurement.

As instrumentation becomes more complex and test requirements more exhaustive, it is even more important to maintain a balance between a simple user interface and minimum test time. Complex test instruments require more user training, and the possibility of human error increases as the number of steps in the test process increases. When production volumes are high enough, many test instruments are completely automated to simplify and speed testing. However, there are many low and medium volume test applications where automation would reduce test time but does not justify the initial cost of purchasing a computer and developing custom software. Therefore, there is a need for built-in automation for manufacturing test.

SUMMARY OF THE INVENTION

One embodiment of the present invention provides a method and apparatus for facilitating definition of test sequences by a user during setup of a signal measurement system for characterizing performance of RF and microwave systems and associated components. The invention provides interactive programming of test sequences Routines are executed in real-time during entry of the steps which comprise the program sequence.

Test sequencing in accordance with the invention enables the user to automate a test without a computer and does not require any additional computer programming expertise. Operation is similar to programming a hand-held calculator. The signal measurement system simply learns the keystrokes typically used to perform a measurement, which can later be executed with the push of a single key. Each test sequence can preferably comprise as many as approximately 200 instructions. All of the test features of the signal measurement system can be automated, augmented by some basic decision-making capability (i.e., IF LIMIT TEST FAILS, DO SEQUENCE TUNE).

The preferred embodiment of the invention provides a user of the signal measurement system with softkey menus for selecting a desired test sequence, including measurement selection for the device to be tested. The signal measurement system prompts the user with a set of displayed softkey selections via a user interface to step the user through the setup process. Preferably, a signal processing unit (or analyzer) included in the signal measurement system incorporates the user interface in firmware to guide and aid the user in defining the desired test sequence. The analyzer preferably displays the softkey menus to guide the user on a cathode ray tube included in the analyzer. This facilitates proper configuration of the signal measurement system for measurements of the characteristics of devices to be tested.

One embodiment of the signal measurement system in accordance with the invention provides compact, integrated, and low cost vector network analyzer solutions for the RF and microwave frequency ranges. These vector network analyzers share a common appearance, easy-to-use operation (front panel and HP-IB) and productivity advantages.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings. In the drawings:

FIG. 2, comprising

DETAILED DESCRIPTION OF THE PREFERRED EMBODIMENTS

Figure 1:
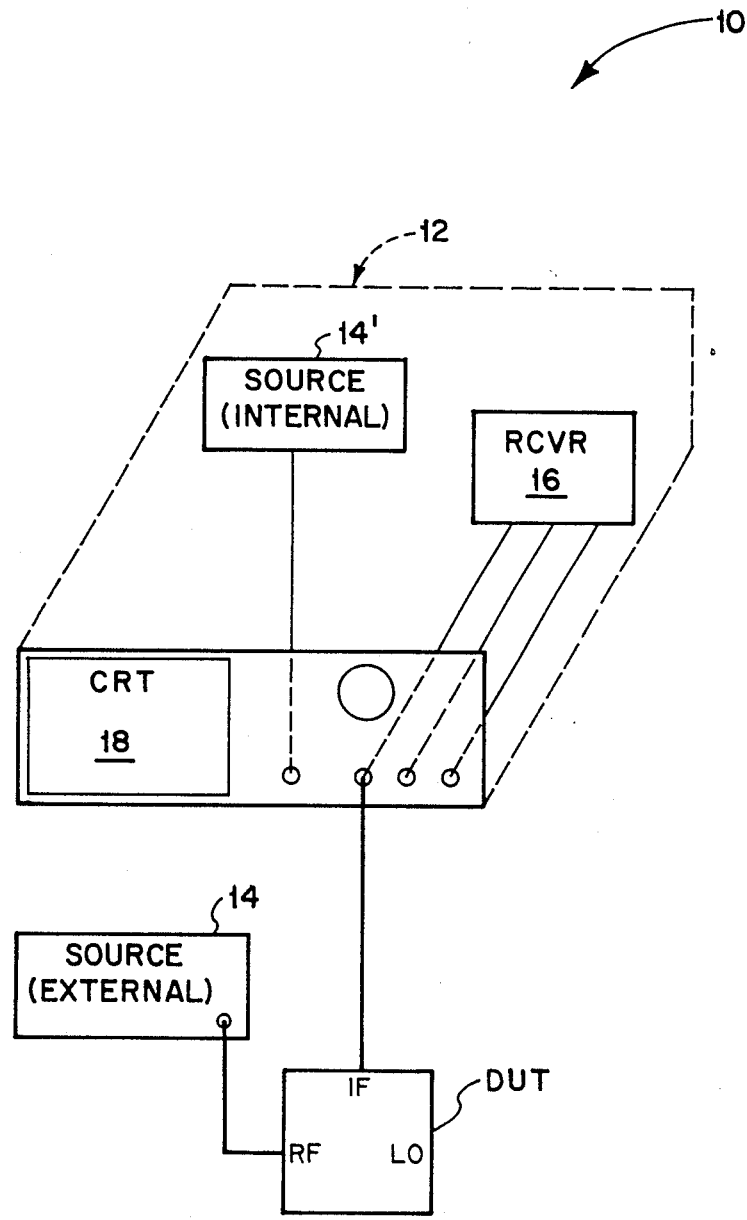
FIG. 1 is a block diagram of a signal measurement system incorporating definition of test sequences by a user in accordance with one embodiment of the invention.

FIG. 1 shows an exemplary signal measurement system in the form of an RF or microwave system and associated component signal measurement system in accordance with one embodiment of the invention, generally indicated by the numeral 10. Its principal elements are a vector network analyzer 12, a source 14, shown as an external source although an internal source 14' can be incorporated, and a receiver 16. All of the elements of the signal measurement system 10, including the source 14 and the receiver 16, are extensively characterized to achieve high levels of precision in measurements. FIG. 1 also shows a device under test (DUT), for example, a mixer connected to the signal measurement system 10.

The vector network analyzer 12 preferably comprises essentially a 3 GHz vector network analyzer, for example, an HP 8753 vector network analyzer available from Hewlett-Packard Company, Network Measurements Division, Santa Rosa, Calif. It provides 300 kHz to 3 GHz or 3 MHz to 6 GHz test signals used to stimulate the DUT.

The electrical characteristics of the source 14 and the receiver 16 in a test setup have to be sensitive, stable, and repeatable. Also, their bandwidths need to be wider than that of the DUT.

The source 14 preferably provides a signal source which generates a high-stability, 1 Hz-frequency-resolution synthesized signal that can be swept from 300 kHz to 3 GHz or from 3 MHz to 6 GHz. The signal from the source 14 is then applied to the DUT.

The receiver 16 demodulates the modulated signal for processing in the vector network analyzer 12. The transmission and reflection characteristics of the DUT are then displayed, preferably on a cathode ray tube (CRT) 1B included in the vector network analyzer 12, either as a function of the RF modulation frequency or as a function of RF power or distance.

The receiver 16 is a high-stability, high-resolution precision receiver with greater than 100 dB dynamic range which allows measurements over a wide dynamic range and enables the signal measurement system 10 to operate with a sensitivity of 0 dBm to −100 dBm over the 300 kHz to 3 GHz measurement range and 0 dBm to −95 dBm over the 3 GHz to 6 GHz measurement range. The receiver 16 has a dynamic accuracy over a 40 dB range of +/−0.05 dB and +/−0.3 degrees. The 3 GHz to 6 GHz bandwidths of the source 14 and the receiver 16 provide ample margin for typical tests.

The signal measurement system 10 is operable to perform various measurements. Although the present invention is not directed to these measurements per se, a general understanding of various types of measurements that can be performed will aid an understanding of the operation of enabling the user to define test sequences in accordance with the invention.

The DUT can be characterized using the signal measurement system 10. Examples of RF and microwave devices are amplifiers, filters, and cables. The RF measurements include bandwidth, insertion loss/gain, phase, group delay, and complex impedance.

Electrical measurements can be performed on such RF components as amplifiers, filters, and cables, or a complete transmitter or receiver Typical measurements include loss/gain versus modulation frequency or power level, modulation bandwidth, modulation phase shift or phase delay, distortion (e.g., group delay or deviation from linear phase), complex impedance (magnitude and phase), harmonic distortion, and electrical length (including discontinuity location).

In accordance with the invention, the signal measurement system 10 incorporates the capability for the user to define a test sequence to provide operating ease. Firmware resident in memory in the signal measurement system 10 generates displays to provide for test measurement setups which allow users unfamiliar with computer program languages to configure the signal measurement system for various types of tests. There are also menus for formatting, scaling, and plotting measurements.

In accordance with the invention, the signal processing unit (or vector network analyzer 12) included in the signal measurement system 10 incorporates in firmware a set of encoded softkey menus which allow the user to define a test sequence for a desired test on the DUT. Code for allowing definition of test sequences is embedded as a portion of the instrument mainframe firmware. Hence, the invention provides a user interface to allow the user greater ease in setting up and executing the measurement process associated with a desired test protocol.

Considered in more detail, the vector network analyzer 12 has programmed into its read only memory (ROM) firmware test sequence codes which are available to be combined to make the signal measurement system 10 easy to operate and use. These test sequence codes enable the user to set up the signal measurement system 10 test measurements easily and quickly. This feature is hereafter referred to as "test sequencing."

Test sequencing is an instrument user interface feature to assist a user in quickly and easily performing a desired test and making a measurement on the DUT. Test sequencing is implemented as a series of softkey menus which guide the user in configuring the signal measurement system 10 and setting basic instrument parameters in order to perform a specified test measurement.

The analyzer 12 displays a softkey menu when the analyzer is turned on. The user is guided through the test sequencing procedure by depressing softkeys. A set of softkey labels (softkey menu) is presented on the display of the vector network analyzer 12 by the firmware for each step in the test sequencing series. As each step of a desired test sequence is entered by the user, the step is displayed on the CRT 18. Also, the displayed steps are preferably overlaid on data measured in accordance with the test sequence.

The test sequencing procedure has various contemplated uses in a test instrument environment. There are several instances where a user might use this automation and several ways a user might develop a program.

First, a research and development environment typically finds a vector network analyzer on a bench used by one person. He or she can have a certain set of simple measurements that he or she makes often, and some more complicated ones that are needed occasionally. For the latter, the user typically uses a BASIC program language (either resident in the test instrument or on a computer) that he or she would spend a week or two to develop, debug, and ready for use. For these simple needs, access to a computer and the effort to set up a program and learn the program language, as well as the specific test instrument mnemonics, would be cost prohibitive. Test sequencing in accordance with the invention dramatically improves productivity in these circumstances, because the only knowledge required is how to use the test instrument.

In a production environment, there is sometimes a need for a complicated test or a large amount of data logging. Generally, an external computer is used for these purposes. There are also cases where high speed is needed. In these cases, a BASIC program language that can run at high speed inside a test instrument, but can be developed separately, is useful. In many production uses, however, high speed or complicated tests are not needed. Mostly, the desire is for a test that is highly repeatable (whether Monday or Friday) by a person with minimum skills. This can be solved by an external computer or by a BASIC program language test instrument, but then a person specializing in developing these programs is needed, and this is a large overhead. Test sequencing in accordance with the invention enables a technician or engineer to develop a test protocol by simply performing the measurement once. Thereafter, the production worker just needs to depress a "DO SEQUENCE" button. This is also useful for a production area that makes small quantities of components where development of specialized tests for these components would be too expensive.

When the test sequencing softkeys are depressed, the analyzer 12 enters a test sequencing mode by calling test sequencing routines stored in the ROM of the analyzer. Test sequencing enables the user to automate a test without a computer and does not require any additional programming expertise. Operation is similar to programming a hand-held calculator. The analyzer 12 simply learns the keystrokes typically used to perform a measurement, which can later be executed with the push of a single key. Each test sequence includes as many as approximately 200 instructions. All of the test features of the analyzer 12 can be automated, augmented by some basic decision-making capability (i.e., IF LIMIT TEST FAILS, DO SEQUENCE TUNE). FIG. 2 is a flow diagram of the test sequencing method in accordance with one embodiment of the invention.

The implementation of test sequencing is programmed into read only memory and uses a set of softkeys and text displayed on the display screen. The major modes of operation are: normal operation, "MODIFY SEQUENCE", and "DO SEQUENCE" modes.

During normal operation, test sequences are not used, but they can exist in memory to be run later.

The MODIFY/creation of a test sequence includes three steps:
1. turning on "MODIFY SEQUENCE"
2. performing the desired measurement
3. entering "DONE MODIFY".

The sequence is now stored and the entire measurement can be executed by pressing the sequence name.

Figure 2A:
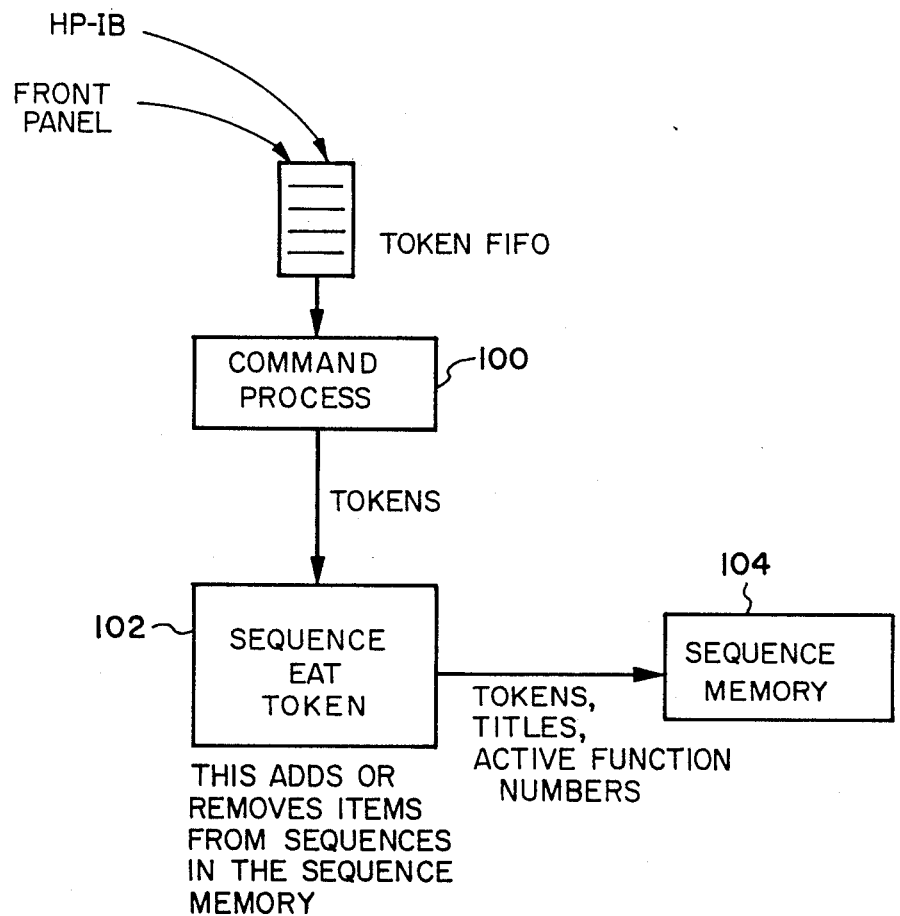
FIGS. 2A and 2B, is a flow diagram of the test sequence method for selecting a new test sequence or modifying a previous test sequence and executing the sequence in accordance with one embodiment of the invention.
Figure 2B:
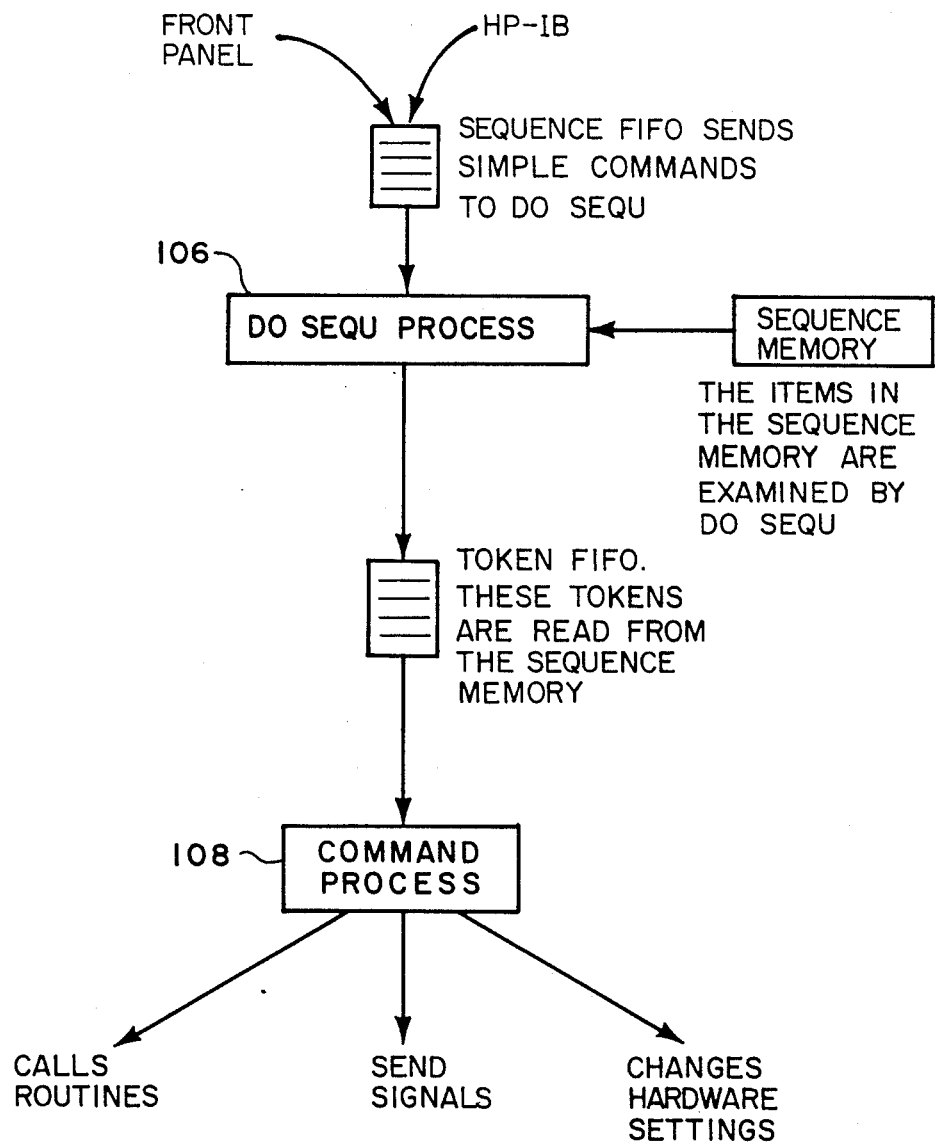
Figure 3:
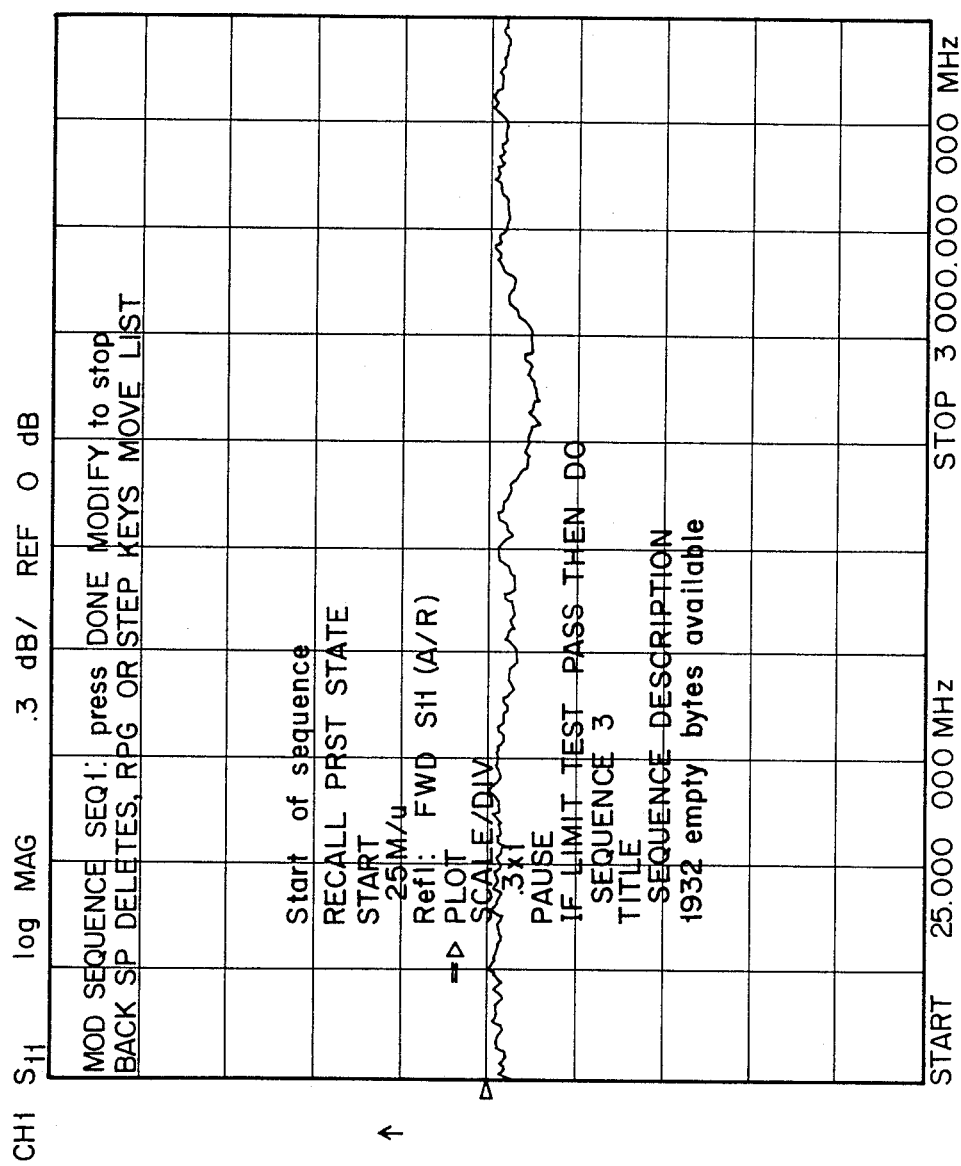
FIG. 3 illustrates a display provided by the signal measurement system shown in FIG. 1 during definition of a test sequence by the user during setup of the signal measurement system.

In the modify mode, all keystrokes are recorded and shown on the display (see FIGS. 2 and 3). The name shown on the softkey function selected is used in the sequence list. These keys are added in the order entered, unless the "RPG" or "ARROW" keys are used to move forward or back through a test sequence. The user can insert a function anywhere in the test sequence simply by entering that function. A step can be deleted by using the "BACKSPACE" key. During this mode, the normal measurement display and softkeys are shown, and all functions entered behave just as without test sequencing turned on (except the "ARROW" keys, "RPG" key, and "BACKSPACE" key). To exit this mode, the user depresses the softkey "DONE MODIFY".

To enter the run mode, the user depresses the "DO SEQUENCE" softkey, and then selects the desired test sequence. The series of keystrokes entered is executed without any user intervention until the test sequence is complete.

Test sequencing also includes the ability to duplicate test sequences, delete them, print them on a printer (for documentation), title them, and store or load them from an external disc. The test sequence can also be sent to an external controller or sent to the test instrument from an external controller. A test sequence can also execute another sequence or branch to a sequence depending on the status of a limit test or loop counter. A "pseudo code" simple description of the test sequencing firmware appears below and in the flow diagram shown in FIG. 2.

```
COMMENT                                                           doSequ
*****************************************************************
*                                                                       *
*                                                                       *
* FUNCTION: to feed sequence list items to the command process.
      The feeding can occur either when the "DO SEQUENCE"
      key is pressed or while the user is modifying a
      sequence and is stepping forwards or backwards through
      a sequence.

*                                                                       *
*****************************************************************
;
PROCEDURE doSequ;                                                 ENTRY;
BEGIN loop: read sequence fifo IF command from fifo is do sequence or resume sequence THEN
      BEGIN  & execute or resume a sequence &
           print Doing Sequence message
           lockout front panel except LOCAL
```

```
          Do sequence items if keyboard is locked out
          and not at end of sequence.
          Local key aborts a running sequence.

enable front panel if there are no more sequences to do
          or if the sequence has paused
          turn off DOING SEQUENCE msg
END ELSE IF command from fifo is scroll up sequence list THEN
BEGIN
          Do the next item in the sequence if we are
          not at the end of the sequence and if the token
          fifo is not full.    ;
     print the updated sequence list
END ELSE IF command from fifo is scroll down sequence list THEN
BEGIN
     print the updated sequence list
END;

GO TO loop;

END; & doSequ &

#EJECT;

TEST SEQUENCING

MODIFY
          INSERT   - Any function is inserted after cursor.
          DELETE   - BACK SP deletes line at cursor.
          STEP     - Use ARROW keys or RPG. ARROW up does the
                     function at the cursor and moves list up.
                     ARROW down only moves list down.
          END      - Press DONE MODIFY in SEQUENCE MENU.

RUN
          START    - Press DO SEQUENCE in SEQUENCE MENU.
          KEYS     - All front panel keys except LOCAL are
                     locked out until sequence stops.
          STOP     - Press LOCAL to stop a running sequence.
          PAUSE    - Press CONTINUE SEQUENCE in SYSTEM MENU
                     to restart a paused sequence.

Only sequence 6 is saved when instrument is turned off.
     For more information, see Test Sequencing chapter in
     System Operating And Programming Manual.
```

As shown in FIG. 2A, when the "MODIFY SEQUENCE" softkey is depressed, the test sequencing mode begins by enabling the user to select a series of steps associated with a desired measurement, as indicated by the numeral 100. The analyzer 12 inserts or deletes commands in a test sequence list, as indicated by the numeral 102. When the user completes the test sequence, he or she depresses the "DONE MODIFY" softkey, and the analyzer 12 stores the test sequence, as indicated by the numeral shown in FIG. 2A.

When the user decides to directly measure the DUT, he or she depresses the "DO SEQUENCE" softkey, as indicated by the numeral 106 shown in FIG. 2B. The analyzer 12 then performs a measurement, as indicated by the numeral 108 shown in FIG. 2B.

A simple example of a test sequence is shown below.
SEQUENCE AMPTEST
Start of Sequence
RECALL 3
HARMONIC OFF
DATA→MEMORY
DATA/MEM SECOND
LIMIT TEST
ON
IF LIMIT TEST PASS THEN DO
   SEQUENCE 2
IF LIMIT TEST FAIL THEN DO
   SEQUENCE 3

This sequence recalls a set-up, measures 2nd harmonic in dBc, checks a test limit, and plots data if test limits are passed.

A list of the front panel commands which can be used in a test sequence appears in Appendix A. One implementation of the vector network analyzer 12 is referred to by the term "HP 8753B". The time domain option refers to the inverse Fourier transform to calculate the time domain step and impulse responses of the DUT. Furthermore, this allows the user to position a time gate over the data, which the analyzer 12 then applies directly to frequency domain data. The transform can also convert continuous wave (CW) time domain data to frequency domain for baseband analysis. A copy of the Firmware code is contained in Appendix B.

Appendix A

| | | |
|---|---|---|
| CORRECTION | on OFF | Turns on error correction. The HP 8753B uses the most recent calibration data for the parameter being displayed. If the stimulus state has been changed since calibration, the state is recalled. Turns on the Cor notation. |
| PWR METER | [OFF] | Enables you to use an external power meter to normalize the output power of the HP 8753B's source with respect to an external measurement. |
| CALIBRATE MENU | | Performs a new calibration. Correction is automatically turned on at the completion of the calibration sequence. Next Menu Table 13 |
| RESUME CAL SEQUENCE | | If a calibration sequence was interrupted, this softkey allows the user to re-enter the sequence at the point of exit. |
| CAL KIT | [7 mm] | Allows the operator to select a default calibration kit or modify the current kit. Calibration kits hold the characteristics of the calibration standards. The defaults are called up by connector type, and are for the standard HP 8753B calibration kits. |
| INTERPOL | on OFF | Allows you to change the number of points or decrease the frequency range of a measurement without losing calibration. |
| MORE | | Leads to the calibrate parameter menu. Next Menu Table 14 |

Table (Page 13)

| | | |
|---|---|---|
| SET FREQ LOW PASS | | Changes the frequency sweep to accommodate time domain low pass mode (option 010). If this mode is used, the frequencies must be set before calibration. |
| CALIBRATE: NONE | | |
| RESPONSE | | Corrects for frequency response as Requires only one standard, using either an open or a short for reflection, or a "thru" for transmission. |
| RESPONSE & ISOL'N | | In transmission, corrects for frequency response and isolation errors. In reflection, corrects for frequency response and directivity errors. Requires two standards. |
| S11 1-PORT | | Corrects for frequency response, directivity, and source match errors from port 1 reflection measurements. Requires three standards. |
| S22 1-PORT | | Same as S11 1-port, but for port 2. |
| FULL 2-PORT | | A full correction for all the errors, in both the forward and reverse directions. |
| ONE-PATH 2-PORT | | A full correction for all the errors, but does not require an S-parameter test set. The operator has to manually reverse the device and retrigger each sweep. [SINGLE SWEEP] will also retrigger the sweep. |

TABLE (PAGE 14)

| | |
|---|---|
| PWRMTR CAL OFF | Controls correction after the calibration data has been taken. When the normalization is on, the [POWER] active function is the power at the power meter plus any specified power loss, not the power at the HP 8753B source output. Turns on PC notation. |
| EACH SWEEP | Sets up the HP 8753B to take calibration data every sweep. This method of calibration is very accurate, but slow. |
| ONE SWEEP | Sets up the HP 8753B to take one sweep of calibration data and use it to set up a table. This table is used as a reference from that point forward until another calibration sweep is taken. |
| TAKE CAL SWEEP | Initiates the sweep of calibration data. Turns power meter cal on. |
| NUMBER OF READINGS | Defines the number of readings to be taken at every frequency. To achieve higher accuracy increase the number of readings. |
| PWR LOSS on-OFF | This offsets the readings of the power meter. |
| LOSS/SENSR LIST | Leads to a menu containing lists of power loss and sensor vs. frequency data. |
| RETURN | Returns to the previous menu. |

TABLE (PAGE 15)

| | |
|---|---|
| PORT EXTENSIONS | Allows the user to enter the reference plane extensions for ports 1 and 2. Extends the apparent reference plane to the end of the port extensions. |
| VELOCITY FACTOR | Enters the velocity factor that the HP 8753B uses to calculate equivalent electrical length. |
| SET Z0 | Sets the characteristic impedance used in calculating measured impedance. |
| ALTERNATE A and B | Alternately samples channels while performing a measurement. |
| CHOP A and B | Simultaneously samples channels allowing simultaneous measurements of $S_{11}$ and $S_{21}$. |
| RETURN | Returns to the previous menu. |

TABLE (PAGE 16)

| | |
|---|---|
| PRINT | Copies the HP 8753B display onto an external printer. The HP 8753B must be in either system controller or pass control mode. |
| PLOT | Plots the current data on an external plotter, according to the current plot definition and configuration. The HP 8753B must be in either system controller or pass control mode. |
| SELECT QUADRANT | Allows the user to select either a full-page plot, or a plot in one of the four quadrants. |
| DEFINE PLOT | Defines what parts of the display are to be plotted. |

Table Next Menu Page 17

| | |
|---|---|
| CONFIGURE PLOT | Specifies the pens to be used during plotting and enters the line types for data and memory traces. |

| | | |
|---|---|---|
| DEFAULT SETUPS | Resets the plot definition and configuration to the preset conditions. | |
| LIST VALUES | Lists the values for each point of the trace. | |
| OPERATING PARAMETERS | Displays a list of key operating parameters and their current values. | |

TABLE 17

| | |
|---|---|
| PLOT DATA ON off | Includes the data trace on the plot. |
| PLOT MEM ON off | Includes the memory trace on the plot. |
| PLOT GRAT ON off | Includes the graticule on the plot. |
| PLOT TEXT ON off | Includes all of the display text on the plot, except for the marker values, frequency list table, and limits table. |
| PLOT MKR ON off | Includes the markers and their values on the plot. |
| SCALE PLOT [FULL] | [FULL] is the normal plot mode. [GRAT] expands the graticule to fill the plot area as defined by P1 and P2. Allows plotting on printed forms. |
| PLOT SPEED [FAST] | Changes between normal plotting at [FAST] speed, and low speed plotting at [SLOW] speed for transparencies. |
| RETURN | Returns to the previous menu. |

TABLE 18

| | |
|---|---|
| DUAL CHAN on OFF | Displays both channels at once. They will be placed on separate graticules if split display mode (page 19) is on. |
| DISPLAY: DATA | Displays the current data. |
| MEMORY | Displays the trace memory of the active channel, using the current display format, scale, and reference. Works only if compatible data has been stored in memory. |
| DATA and MEMORY | Displays both the current data and memory traces, with identical scaling and format. |
| DATA/MEM | Vector trace math. Divides the data by memory, normalizing the data to the memory. The math is performed on the linear data, before display formatting. |
| DATA-MEM | Subtracts the memory from the data. The vector subtraction is performed on the linear data, before display formatting. |
| DATA → MEMORY | Stores the active trace in the memory of the active channel. |
| MORE | Leads to more display choices. |

Next Menu Table Page 19

TABLE (PAGE 19)

| | |
|---|---|
| SPLIT DISP ON off | Displays each channel on a separate graticule when dual channel mode is on. |
| BEEP DONE ON off | Sounds the beeper whenever the HP 8753B is done with certain functions, such as data to memory, measuring a calibration standard, or saving an instrument state. |
| BEEP WARN on OFF | Sounds the beeper whenever a warning message is displayed. |
| INTENSITY | Sets the CRT intensity as a percent of the brightest setting. |
| FOCUS | Sets the CRT focus as a percent of the maximum focus voltage. |
| TITLE | Enters the display title. This title also appears on plots and prints. |
| MORE | Leads to frequency blank key, that blanks the frequency notation on the display. Pressing [PRESET] or turning the line switch off and then on will re-enable the frequency notation. Also contains access to (Channel 1/Channel 2) measurements. |
| RETURN | Returns to the previous menu. |

TABLE (PAGE 20)

| | |
|---|---|
| LOG MAG | Displays the log magnitude of the data in dB. |
| PHASE | Displays the phase portion of the data in degrees. |
| DELAY | Displays group delay. Group delay is the derivative of phase with respect to frequency. Since the aperture is the frequency step, it will vary across log and list frequency sweeps. Smoothing can increase the aperture. |
| SMITH CHART | Displays the data on a Smith chart. There are special marker modes for this format. |
| POLAR | Displays the data in a polar format. There are special marker modes for this format. |
| LIN MAG | Displays the linear magnitude of the data. |
| MORE | Leads to more display choices. |
| SWR | Displays the data formatted into SWR. |

TABLE (PAGE 22)

| | |
|---|---|
| SYSTEM CONTROLLER | This is the normal manual operation mode, allowing the HP 8753B to control peripherals over HP-IB. It is intended to be used only when no other controller is on HP-IB. |
| TALKER/ LISTENER | This is the normal remote operation mode, making the HP 8753B dependent on an external controller for peripheral control. |
| USE PASS CONTROL | This mode allows both local and remote use of the HP 8753B. Requires a smart controller. |
| SET ADDRESSES | Leads to the HP-IB address menu. This menu allows the operator to enter the HP-IB addresses of peripherals. |
| HP-IB DIAG on OFF | Scrolls incoming HP-IB commands across the display. |

| | | |
|---|---|---|
| DISC UNIT NUMBER | Selects which disc unit in a multiple-unit disc drive is accessed by the load/store to disc functions. | |
| VOLUME NUMBER | Selects which volume of a hard disc is accessed by the load/store to disc functions. Should be set to 0 for flexible disc drives. | |

TABLE

| | | |
|---|---|---|
| A/R | Measures the ratio of input A to input R. | |
| B/R | Measures the ratio of input B to input R. | |
| A/B | Measures the ratio of input A to input B. | |
| A | Measures the signal at input A. | |
| B | Measures the signal at input B. | |
| R | Measures the signal at input R. | |
| CONVERSION [OFF] | Repeats the data as transmittance, admittance, or inverted S-parameters instead of S-parameters. | |
| S-PARAMETERS | Brings up the S-parameter menu. Next Menu Table 24 | |

TABLE

| | |
|---|---|
| Refl: FWD S11 (A/R) | Configures the S-parameter test set so that A/R measures S11, and annotates the display as S11. If no S-parameter test set is present, the HP 8753B will measure A/R and annotate the display as S11. |
| Trans: FWD S21 (B/R) | Configures the S-parameter test set so that B/R measures S21, and annotates the display as S21. If no S-parameter test set is present, the HP 8753B will measure B/R and annotate the display as S21. |
| Trans: REV S12 (A/R) | Configures the S-parameter test set so that B/R measures S22, and annotates the display as S12. If there is no S-parameter test set present, then the HP 8753B measures B/R and annotates the display as S12. |
| Refl: REV S22 (B/R) | Configures the S-parameter test set so that B/R measures S22, and annotates the display as S22. If there is no S-parameter test set present, then the HP 8753B measures A/R and annotates the display as S22. |
| AUXILIARY INPUT | Measures the signal at the rear panel AUX INPUT. Also has service functions. |
| CONVERSION [OFF] | Formats the data as impedance, admittance, or inverted S-parameters. |
| INPUT PORTS | Brings up the port measurement menu. |

TABLE

| | |
|---|---|
| POWER | Leads to the power menu, which controls the output power and slope compensation, and the attenuators in S-parameter test sets. |
| SWEEP TIME MANUAL | Sets manual control of the sweep time. The actual sweep time may increase from the entered sweep time as more functions are activated. Next Menu Table 28 |

| | |
|---|---|
| SWEEP TIME AUTO | Enters the sweep time. The actual sweep time may increase from the metered sweep time as more functions are activated. |
| TRIGGER MENU | Leads to the sweep trigger menu.<br>Next Menu Table 29 |
| NUMBER of POINTS | Enters the number of data points per trace, ranging from 3 to 1601. A greater number of points gives greater data density, but slows the sweep and requires more memory for saving instrument states and performing calibrations. |
| MEASURE RESTART | Restarts the sweep. If a 2-port calibration is active, the forward and reverse parameters are measured. |
| COUPLED CH ON off | Locks both channels into the same stimulus values. Uncoupled channels cause the HP 8753B to alternate between the two sets of stimulus values. |
| CW FREQ | Sets the frequency for CW time sweep. |
| SWEEP TYPE MENU | Leads to the sweep type menu.<br>Next Menu Table 30 |

Table (Page 26)

| | |
|---|---|
| POWER | Sets the RF source power. |
| SLOPE | Enters the desired increase in RF power per GHz of sweep. |
| SLOPE on OFF | Increases the output power with frequency, the sweep starting at the selected power level and increasing with the entered slope value. Counteracts frequency related losses. Calibrate with slope on if it is to be used. |
| POWER TRIP on OFF | When on, an overload condition was detected on one of the inputs and power was reduced to its minimum level. Turning trip off restores the power level with the [POWER] key. |
| ATTENUATOR PORT 1 | Controls the port 1 programmable attenuator in the S-parameter test set. |
| ATTENUATOR PORT 2 | Controls the port 2 programmable attenuator in the S-parameter test set. |
| RETURN | |

Table (Page 27)

| | |
|---|---|
| HOLD | Stops updating the sweep. |
| SINGLE | Executes a single sweep, and then goes into hold. |
| NUMBER of GROUPS | Executes the entered number of groups, and then goes into hold. Measuring a group updates an error corrected trace once, which, depending on the calibration used, may entail more than one sweep. |
| CONTINUOUS | Continuously updates the sweep. |
| EXT TRIG on OFF | Triggers the HP 8753B's sweep off the rear panel EXTERNAL TRIGGER input. |
| RETURN | Returns to the previous menu. |

TABLE (Page 28)

| | | |
|---|---|---|
| LIN FREQ | Activates a simple linear frequency sweep. With option 010, the HP 8753B can translate this data to time domain. | |
| LOG FREQ | Activates a logarithmic frequency sweep. The data is sampled logarithmically and displayed. | |
| LIST FREQ | Sweeps across the user defined frequency list. The sweep may be defined as a single segment sweep ([SINGLE SEG SWEEP] softkey) or an all segment sweep ([ALL SEGS SWEEP] softkey). The frequency list table can be entered and modified with [EDIT LIST]. | Next Menu Table 28 |
| POWER SWEEP | Sweeps power at a single frequency. That frequency is set with [CW FREQ]. Power sweep is used to characterize power sensitive networks. | |
| CW TIME | Tunes the HP 8753B to a single frequency and displays the data versus time. The frequency is set with [CW FREQ]. With option 010 (time domain), the HP 8753B can translate this data to the frequency domain. | |
| EDIT LIST | Allows the user to create or modify the frequency list table. | Next Menu Table 28 |
| RETURN | Returns to the previous menu. | |

TABLE (Page 31)

| | | |
|---|---|---|
| MARKER 1 | Turns on marker 1, and makes it the active marker. The annotation Δ REF = 1 indicates that this marker is the delta reference marker. | |
| 2 | Turns on marker 2. | |
| 3 | Turns on marker 3. | |
| 4 | Turns on marker 4. | |
| all OFF | Turns off all markers. | |
| Δ MODE MENU | Leads to the delta mode menu. | Next Menu Table 32 |
| MKR ZERO | Zeros the marker values. Once activated, all marker values are the difference between the current position of the active marker and the zero position. Canceled by turning delta mode off. | |
| MARKER MODE MENU | Allows the user to select special marker modes. | Next Menu Table 33 |

TABLE (Page 32)

| | |
|---|---|
| Δ REF = 1 | Marker 1 becomes the delta reference marker. With a delta reference defined, all marker amplitude and stimulus values are the offset between the active marker position and the delta reference position. |

| | |
|---|---|
| ΔREF = 2 | Makes marker 2 the delta reference. |
| ΔREF = 3 | Makes marker 3 the delta reference. |
| ΔREF = 4 | Makes marker 4 the delta reference. |
| ΔREF = Δ FIXED MKR | Turns on a fixed delta reference. A small triangle marks the reference point defined. All marker values are relative to this point. The fixed position is entered with marker zero or [MARKER OFFSETS]. |
| ΔMODE OFF | Returns markers to absolute mode. |
| FIXED POSITION | Leads to a menu that allows the user to specify fixed marker offsets. Marker zero enters the marker position as the fixed marker position. |
| RETURN | Returns to the previous menu. |

TABLE (33)

| | |
|---|---|
| MARKERS: DISCRETE | Puts markers only on measured points. |
| CONTINUOUS | Interpolates the marker placement and values between measured points. |
| MARKERS: COUPLED | Puts the markers on the same stimulus values on each channel. |
| UNCOUPLED | Makes the markers independent between the channels. |
| POLAR MKR MENU | Selects the marker readout format for polar display. The HP 8753B will display the marker values as linear or log magnitude, or as a real/imaginary pair. |
| SMITH MKR MENU | Selects the marker readout format for a Smith chart display. Same as polar markers with the additional choices of complex impedance or admittance. |
| RETURN | Returns to the previous menu. |

TABLE (35)

| | |
|---|---|
| MARKER → START | Changes the start stimulus value to the marker stimulus value. |
| MARKER → STOP | Changes the stop stimulus value to the marker stimulus value. |
| MARKER → CENTER | Changes the center stimulus value to the marker stimulus value. |
| MARKER → SPAN | Takes the span between the active marker and the delta reference marker, and makes that the stimulus span. |
| MARKER → REFERENCE | Changes the reference value to the marker amplitude value. |
| MARKER → DELAY | Flattens the phase trace at the marker by adding in electrical delay. |
| MKR SEARCH [OFF] | Leads to the search menu, from which the marker placement search parameter is selected. Next Menu Table 3b |
| STATS on OFF | Activates the trace statistics function. |

TABLE a (PAGE 36)

| | |
|---|---|
| SEARCH: OFF | Turns the active search function off. |
| MAX | Moves the marker to the trace maximum. |
| MIN | Moves the marker to the trace minimum. |
| TARGET | Moves the marker to the specified amplitude value on the trace. Leads to a menu with search right and search left options to resolve multiple solutions. |
| WIDTH VALUE | The amplitude parameter for the widths search. |
| WIDTHS on OFF | Calculates the center stimulus, bandwidth, and Q of a bandpass or band reject shape on the trace. The width value is the amplitude search parameter that defines the passband or reject band. |
| TRACKING on OFF | Makes the HP 8753B track the search with each new sweep. |
| RETURN | Returns to the previous menu. |

TABLE a (PAGE 39)

| | |
|---|---|
| AUTO SCALE | Finds the trace and scales it so that it fits on the graticule. |
| SCALE/DIV | Changes the trace scaling. |
| REFERENCE POSITION | Moves the reference line up and down the graticule, 0 being the bottom of the graticule, and 10 the top. |
| REFERENCE VALUE | Changes the value of the reference line. In polar and Smith chart formats, the reference value is the value at the outer circle. |
| MARKER → REFERENCE | Makes the amplitude at the active marker the reference value. |
| MARKER → DELAY | Sets the electrical delay so that the group delay is 0 at the marker. This flattens the phase trace at the marker. |
| ELECTRICAL DELAY | Adds or subtracts electrical time delay from the data. Simulates adding or removing linear phase from a measurement. |
| PHASE OFFSET | Adds the specified offset to the measured phase value. |

TABLE a (PAGE 42)

| | |
|---|---|
| DO SEQUENCE | Executes a specified sequence. |
| NEW SEQ/ MODIFY SEQ | Allows you to create a new or modify an existing sequence. |
| DONE MODIFY | Indicates the completion of modification or creation of a sequence. |
| STORE SEQ TO DISC | Stores a sequence to an external disc. |
| LOAD SEQ FROM DISC | Loads a sequence from an external disc. |

| | | |
|---|---|---|
| SPECIAL FUNCTIONS | Leads to the display of titling and decision making capabilities. | |
| MORE | Leads to more display choices, such as duplicating, printing, titling, and clearing a sequence. | |
| RETURN | Returns to the previous menu. | |

TABLE a

| | |
|---|---|
| DECISION MAKING | Leads to a menu that controls pass/fail testing capability and loop counter control. |
| TITLE TO PRINTER | Enables you to send a title including letters, numbers, some punctuation, and several control characters to a printer over HP-IB. |
| TITLE TO P MTR/HPIB | Enables you to send a command in the form of a title to a HP-IB controllable power meter. |
| WAIT X | This will pause the execution of a sequence for X seconds. |
| PAUSE | This command will temporarily stop the execution of a sequence. The keyboard will be freed up allowing the user to change an instrument parameter, or modify an equipment configuration. The sequence can be re-started by pressing the continue or sequence menu keys. |
| MARKER → CW | Moves a marker to a predefined CW frequency, during the execution of a sequence. |
| MORE | Leads to more display choices |
| RETURN | Returns to the previous menu. |

TABLE a

| | |
|---|---|
| EMIT BEEP | Emits a beep of fixed tone and duration during the execution of a sequence. |
| TTL OUT HIGH | Sets the TTL line, at the back of the HP 85047A test, high. |
| TTL OUT LOW | Sets the TTL line, at the back of the HP 85047A test, low. |
| REMEMBER MENUS | Enables the recall of menus from within a sequence. This is especially useful when prompting someone for a softkey response in an interactive test situation. |
| PHSLK TRIG on OFF | |
| RETURN | Returns to the previous menu. |

TABLE a

| | |
|---|---|
| LIMIT LINE on OFF | Draws the limit lines. |
| LIMIT TEST on OFF | Tests each sweep for measured points that are out-of-limit. |
| BEEP FAIL on OFF | Sounds the beeper when the limit test fails. |
| EDIT LIMIT LINE | Allows the user to enter and modify limit lines. |

| | | Next Menu Table |
|---|---|---|
| LIMIT LINE OFFSETS | Allows the user to offset the limit lines in stimulus and amplitude. | |
| RETURN | Returns to the previous menu. | |

Table

| SEGMENT | Selects the segment to be edited either by entering the segment number, or by using the front panel knob or step keys. |
|---|---|
| EDIT | Brings the selected segment up for editing. |
| DELETE | Deletes the entry indicated by the pointer. |
| ADD | Adds a new entry at the pointer. |

Next Menu Table

| LIMIT TYPE | Allows the user to select the type of limit for the current segment. There are sloping line (SL), flat line (FL), or single point (SP) limit types. |
|---|---|
| DONE | Returns to the previous menu. |

Table

| STIMULUS VALUE | Enters the starting stimulus value of this segment. |
|---|---|
| MARKER → STIMULUS | Enters the marker stimulus as the start of this segment. |
| UPPER LIMIT | Enters the top limit. |
| LOWER LIMIT | Enters the bottom limit. |
| DELTA LIMITS | Instead of upper/lower limits, enters amplitude between the the limit lines. |
| MIDDLE VALUE | Instead of upper/lower limits, enters the center amplitude between the limit lines. |
| MARKER → MIDDLE | Makes the marker amplitude the middle value between the limit lines. |
| DONE | Returns to the previous menu. |

Table

| TRANSFORM on OFF | Turns on the transform and displays the time domain response of a linear frequency sweep, or the frequency domain response of a CW time sweep. |
|---|---|
| SET FREQ LOW PASS | Sets the frequencies to harmonic intervals, keeping the number of points the same. Required for low pass mode. |
| LOW PASS IMPULSE | Makes the transform display the impulse response. Use the real data format. |
| LOW PASS STEP | Makes the transform display the step response of the DUT. Use the real data format. |

| | |
|---|---|
| <u>BANDPASS</u> | Makes the transform display the impulse response. Can operate with band-limited frequency data. The most useful data formats are linear and log magnitude. |
| WINDOW | Places a window over the frequency domain data to minimize the effect of abrupt frequency cutoff at the ends of the sweep. Also controls amplitude and phase demodulation |
| SPECIFY GATE | Allows you to place a time gate over both frequency and time domain data. The gate shape is selectable. *Next Menu Table Page 39* |
| RETURN | Returns to the previous menu. |

TABLE (50)

| | |
|---|---|
| GATE on OFF | Turns the gate on and off. Although the gate is set in the time domain, it is actually applied to the frequency domain data. |
| GATE: START | Sets the start time of the gate. |
| STOP | Sets the stop time of the gate. |
| CENTER | Sets the center of the gate. |
| SPAN | Sets the span of the gate. |
| GATE SHAPE | Allows the user to trade a very flat gate passband at maximum gate shape with very fast cutoff at minimum gate. |
| RETURN | Returns to the previous menu. |

TABLE (51)

| | |
|---|---|
| HARMONIC OFF | Turns off harmonic measurement mode so that the receiver is no longer tracking over a harmonic of the source frequency range. |
| SECOND | Enables the receiver to track the second harmonic of the source's fundamental frequency range. This measurement is made on a non-ratio basis. |
| THIRD | Enables the receiver to track the third harmonic of the source's fundamental frequency range. This measurement is made on a non-ratio basis. |
| RETURN | Returns to the previous menu. |

TABLE (52)

| | |
|---|---|
| NETWORK ANALYZER | This is the default mode of the HP 8753B. |
| EXT SOURCE AUTO | Enables the HP 8753B to phaselock to an external CW frequency. Ext source auto will search the entire measurement frequency range for a signal to lock to. |
| EXT SOURCE MANUAL | Enables the HP 8753B to phaselock to an external CW frequency. Ext source manual will try to phaselock to the CW frequency set up by the user. This manual mode enables the HP 8753B to operate at a much faster rate than in auto mode. |

| | |
|---|---|
| TUNED RECEIVER | This mode of operation will tune the HP 8753B to a user specified frequency. Because the instrument bypasses all phaselock routines this mode of operation is very fast but requires the use of very stable source so that signals to be measured will fall within the IF bandwidth of the instrument. This typically requires a synthesizer, that can supply an external reference to the HP 8753B. |
| FREQ OFFS on OFF | This feature allows the frequency of the HP 8753B's source to be offset above its receiver by a constant value. |
| OFFSET VALUE | Specifies the fixed frequency offset between source and receiver offset mode. |
| RETURN | Returns to the previous menu. |

| | |
|---|---|
| AVERAGING RESTART | AVERREST |
| AVERAGING FACTOR | AVERFACT |
| AVERAGING on OFF | AVERON, AVEROFF |
| SMOOTHING APERTURE | SMOOAPER |
| SMOOTHING on OFF | SMOOON, SMOOOFF |
| IF BW [3000 Hz] | IFBW |

| | |
|---|---|
| CORRECTION on OFF | CORR ON |
| INTERPOL on OFF | CORI ON CORI OFF |
| CALIBRATE MENU | |
| RESUME CAL SEQUENCE | RESC |
| CAL KIT [7 mm] | |
| PWR METER [off] | |
| MORE | |

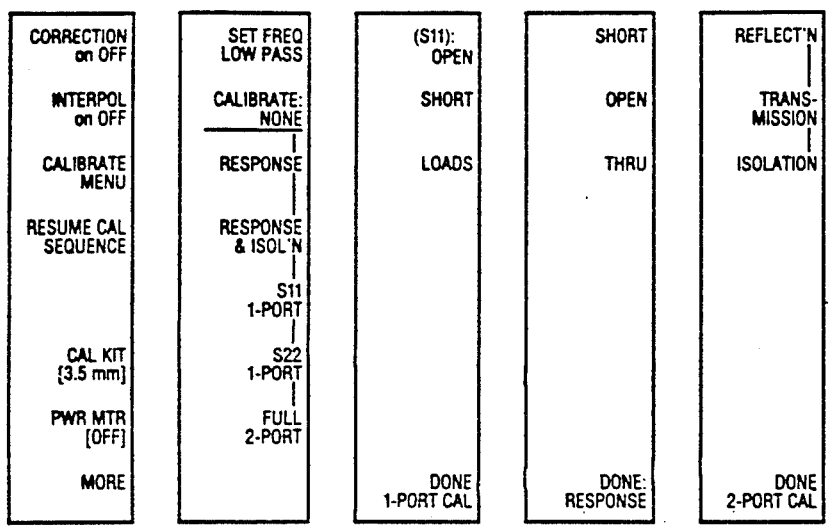
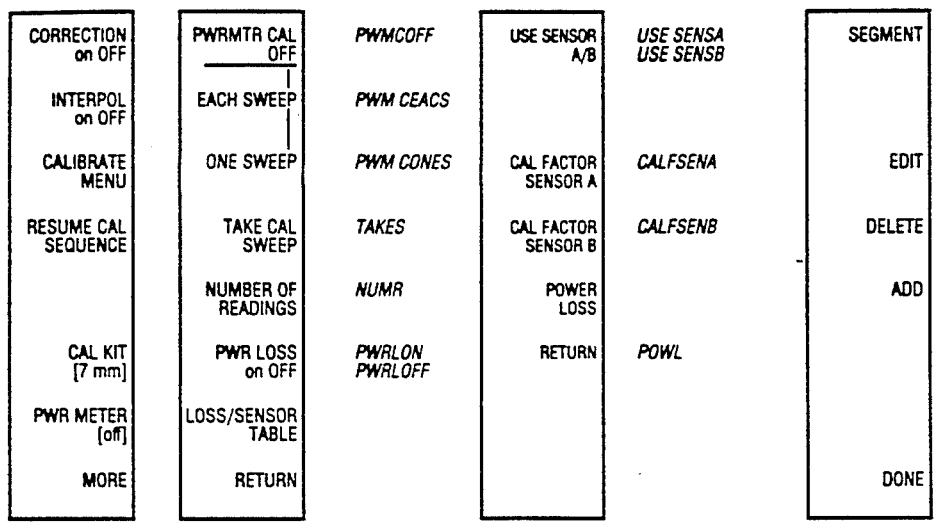
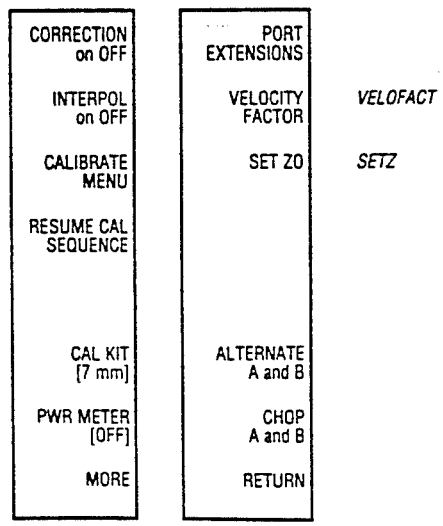

| PRINT | PRINALL | PEN NUM DATA | PENNDATA | DUAL CHAN on OFF | | SPLIT DISP ON off | SPLD |
|---|---|---|---|---|---|---|---|
| PLOT | PLOT | PEN NUM MEMORY | PENNMEMO | DISPLAY: DATA | | BEEP DONE ON off | BEEPDONEON, BEEPDONEOFF |
| SELECT QUADRANT | LEFL,LEFU, RIGL,RIGU | PEN NUM GRATICULE | PENNGRAT | MEMORY | | BEEP WARN on OFF | BEEPWARNON, BEEPWARNOFF |
| DEFINE PLOT | | PEN NUM TEXT | PENNTEXT | DATA and MEMORY | | INTENSITY | INTE |
| CONFIGURE PLOT | | PEN NUM MARKER | PENNMARK | DATA/MEM | | FOCUS | FOCU |
| DEFAULT SETUPS | DFLT | LINE TYPE DATA | LINTDATA | DATA-MEM | | TITLE | TITL |
| LIST VALUES | LISV | LINE TYPE MEMORY | LINTMEMO | DATA → MEMORY | | FREQUENCY BLANK | FREO |
| OPERATING PARAMETERS | OPEP | RETURN | | MORE | | RETURN | |

| PRINT | | PLOT DATA ON off | PDATAON, PDATAOFF | LOG MAG | LOGM | REAL | REAL |
|---|---|---|---|---|---|---|---|
| PLOT | | PLOT MEM ON off | PMEMON, PMEMOFF | PHASE | PHAS | IMAGINARY | IMAG |
| SELECT QUADRANT | | PLOT GRAT ON off | PGRATON, PGRATOFF | DELAY | DELA | | |
| DEFINE PLOT | | PLOT TEXT ON off | PTEXTON, PTEXTOFF | SMITH CHART | SMIC | | |
| CONFIGURE PLOT | | PLOT MRK ON off | PMKRON, PMKROFF | POLAR | POLA | | |
| DEFAULT SETUPS | | SCALE PLOT [FULL] | SCAPFULL, SCAPGRAT | LIN MAG | LINM | | |
| LIST VALUES | | PLOT SPEED [FAST] | PLOSLOW, PLOSFAST | SWR | | | |
| OPERATING PARAMETERS | | RETURN | | MORE | SWR | | |

| DUAL CHAN on OFF | DUACON, DUACOFF | | | SYSTEM CONTROLLER | | ADDRESS: 8753 | |
|---|---|---|---|---|---|---|---|
| DISPLAY: DATA | DISPDATA | | | TALKER/ LISTENER | TALKLIST | ADDRESS: PLOTTER | ADDRPLOT |
| MEMORY | DISPMEMO | | | USE PASS CONTROL | USEPASC | ADDRESS: PRINTER | ADDRPRIN |
| DATA and MEMORY | DISPDATM | | | SET ADDRESSES | | ADDRESS: DISC | ADDRDISC |
| DATA/MEM | DISPDDM | | | | | ADDRESS: CONTROLLER | ADDRCONT |
| DATA-MEM | DISPDMM | | | HP-IB DIAG on OFF | DEBUON, DEBUOFF | ADDRESS PWRMTR | ADDRPOWM |
| DATA → MEMORY | DATI | | | DISC UNIT NUMBER | DISCUNIT | PWRMTR [438A] | PWOMOFF, POWMON |
| MORE | | | | VOLUME NUMBER | DISCVOLU | RETURN | |

| | |
|---|---|
| A/R | AR |
| B/R | BR |
| A/B | AB |
| A | MEASA |
| B | MEASB |
| R | MEASR |
| CONVERSION [OFF] | |
| S PARAMETERS | |

| | |
|---|---|
| POWER | |
| SWEEP TIME | |
| TRIGGER MENU | |
| NUMBER of POINTS | |
| MEASURE RESTART | |
| COUPLED CH ON off | |
| CW FREQ | |
| SWEEP TYPE MENU | |

| | |
|---|---|
| POWER | POWE |
| SLOPE | SLOPE |
| SLOPE on OFF | SLOPON, SLOPOFF |
| POWER TRIP on OFF | POWTON, POWTOFF |
| ATTENUATOR PORT 1 | ATTP1 |
| ATTENUATOR PORT 2 | ATTP2 |
| RETURN | |

| | |
|---|---|
| Refl: FWD S11 | S11 |
| Trans: FWD S21 | S21 |
| Trans: REV S12 | S12 |
| Refl: REV S22 | S22 |
| AUXILIARY INPUT | ANAI |
| CONVERSION [OFF] | |
| MEASURE RESTART | REST |

| | |
|---|---|
| POWER | |
| SWEEP TIME | |
| TRIGGER MENU | |
| NUMBER of POINTS | |
| COUPLED CH ON off | |
| CW FREQ | |
| SWEEP TYPE MENU | |

| | |
|---|---|
| HOLD | HOLD |
| SINGLE | SING |
| NUMBER of GROUPS | NUMG |
| CONTINUOUS | CONT |
| EXT TRIG TRIG OFF | EXTTOFF |
| TRIG on SWEEP | |
| TRIG on POINT | EXTTON, EXTTPOIN |
| RETURN | |

| | |
|---|---|
| POWER | POWE |
| SWEEP TIME | SWET |
| TRIGGER MENU | SWEA |
| NUMBER OF POINTS | |
| MEASURE RESTART | POIN |
| COUPLED CH ON off | COUCON, COUCOFF |
| CW FREQ | CWFREQ |
| SWEEP TYPE MENU | |

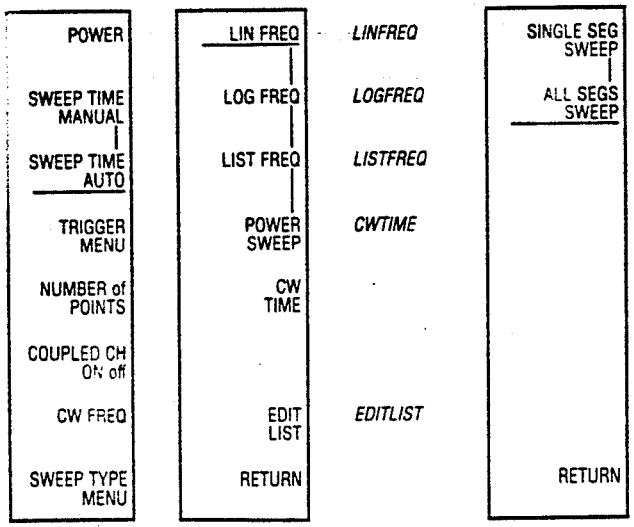
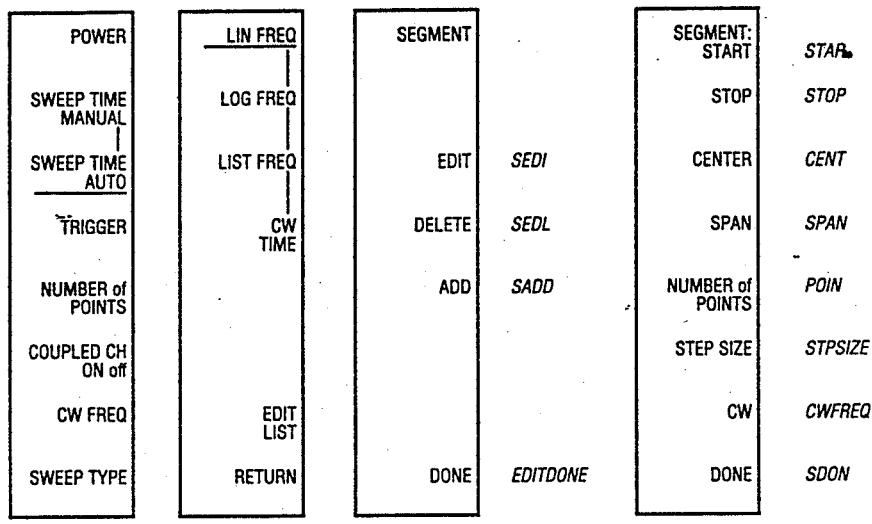
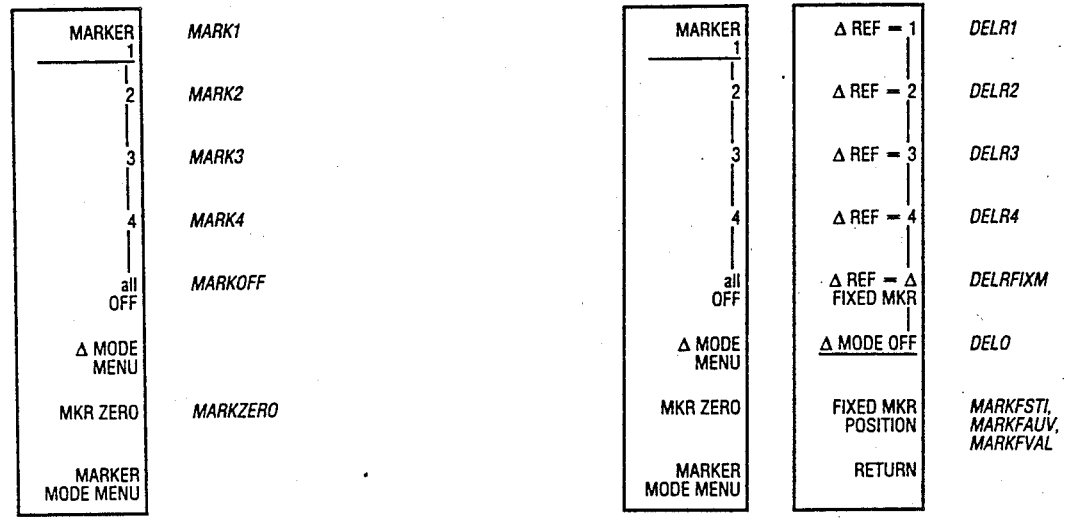

| MARKER 1 — 2 — 3 — 4 — all OFF | MARKERS: DISCRETE — CONTINUOUS | MARKDISC MARKCONT | LIN MKR — LOG MKR — Re/Im MKR | POLMLIN POLMLOG POLMRI | LIN MKR — LOG MKR — Re/Im MKR — R+jX MKR — G+jB MKR | SMIMLIN SMIMLOG SMIMRI SMIMRX SMIMGB |
|---|---|---|---|---|---|---|
| Δ MODE MENU | MARKERS: COUPLED — UNCOUPLED | MARKCOUP MARKUNCO | | | | |
| MKR ZERO | POLAR MKR MENU | | | | | |
| MARKER MODE MENU | SMITH MKR MENU | | | | | |
| | RETURN | | RETURN | | RETURN | |

| MARKER→ START | MARKSTAR |
|---|---|
| MARKER→ STOP | MARKSTOP |
| MARKER→ CENTER | MARKCENT |
| MARKER→ SPAN | MARKSPAN |
| MARKER→ REFERENCE | MARKREF |
| MARKER→ DELAY | MARKDELA |
| MKR SEARCH [OFF] | |
| STATS on OFF | |

| RE-SAVE REG 1 | SAVE1 | RECALL REG 1 | RECA1 |
|---|---|---|---|
| RE-SAVE REG 2 | SAVE2 | RECALL REG 2 | RECA2 |
| RE-SAVE REG 3 | SAVE3 | RECALL REG 3 | RECA3 |
| RE-SAVE REG 4 | SAVE4 | RECALL REG 4 | RECA4 |
| RE-SAVE REG 5 | SAVE5 | RECALL REG 5 | RECA5 |
| CLEAR REGISTER | | | |
| TITLE REGISTER | | RECALL PRST STATE | PRES |
| STORE TO DISC | | LOAD FROM DISC | |

| MARKER→ START | | SEARCH: OFF | SEAOFF |
|---|---|---|---|
| MARKER→ STOP | | MAX | SEAMAX |
| MARKER→ CENTER | | MIN | SEAMIN |
| MARKER→ SPAN | | TARGET | SEATARG |
| MARKER→ REFERENCE | | WIDTH VALUE | WIDV |
| MARKER→ DELAY | | WIDTHS on OFF | WIDTON, WIDTOFF |
| MKR SEARCH [OFF] | | TRACKING on OFF | TRACKON, TRACKOFF |
| STATS on OFF | | RETURN | |

| | | | | | |
|---|---|---|---|---|---|
| RE-SAVE REG 1 | STORE FILE 1 | DATA ARRAY on OFF | EXTMDA; EXTMDA; | INITIALIZE DISC | INID |
| RE-SAVE REG 2 | STORE FILE 2 | RAW ARRAY on OFF | EXTMRAW; EXTMRAW; | SAVE | SAVUBINA |
| RE-SAVE REG 3 | STORE FILE 3 | FORMAT ARY on OFF | XTMFORMON, XTMFORMOFF | | SAVUASCI |
| RE-SAVE REG 4 | STORE FILE 4 | GRAPHICS on OFF | XTMGRAPON, XTMGRAPOFF | | |
| RE-SAVE REG 5 | STORE FILE 5 | DATA ONLY on OFF | EXTMDATOON, EXTMDATAOFF | | |
| CLEAR REGISTER | DEFINE STORE | PURGE FILES | | | |
| TITLE REGISTER | TITLE FILES | MORE | | | |
| STORE TO DISC | RETURN | RETURN | | RETURN | |

| | |
|---|---|
| AUTO SCALE | AUTO |
| SCALE/DIV | SCAL |
| REFERENCE POSITION | REFP |
| REFERENCE VALUE | REFV |
| MARKER→ REFERENCE | MARKREF |
| MARKER→ DELAY | MARKDELA |
| ELECTRICAL DELAY | ELED |
| PHASE OFFSET | PHAO |

| |
|---|
| SEQUENCING MENU |
| |
| LIMIT MENU |
| TRANSFORM MENU |
| FREQ RANGE 3GHz6GHz |
| HARMONIC MEAS |
| INSTRUMENT MODE |
| SERVICE MENU |

| SEQUENCING MENU | DO SEQUENCE | | SEQUENCE SEQ | SEQ1 |
|---|---|---|---|---|
| | NEW SEQ/ MODIFY SEQ | NEWS | SEQUENCE | SEQ2 |
| LIMIT MENU | DONE MODIFY | DONM | DUPLICATE SEQUENCE | DUPLSEQ | SEQ2 |
| TRANSFORM MENU | STORE SEQ TO DISC | STORESEQ | PRINT SEQUENCE | PRINSER |
| FREQ RANGE 3GHz6GHz | LOAD SEQ FROM DISC | LOADSEQ | TITLE SEQUENCE | TITLESEQ |
| HARMONIC MEAS | SPECIAL FUNCTIONS | | CLEAR SEQUENCE | CLEASEQ |
| INSTRUMENT MODE | MORE | | | |
| SERVICE MENU | RETURN | | RETURN | RETURN |

| SEQUENCING MENU | DO SEQUENCE | DECISION MAKING | | IF LIMIT TEST PASS | IFLTPASS |
|---|---|---|---|---|---|
| | NEW SEQ/ MODIFY SEQ | TITLE TO PRINTER | TITT PRIN | IF LIMIT TEST FAIL | IFLTFAIL |
| LIMIT MENU | DONE MODIFY | TITLE TO PWMTR/HPIB | TITT PMTR | LOOP COUNTER | LOOC |
| TRANSFORM MENU | STORE SEQ TO DISC | WAITX | SEQWAIT | INCR LOOP COUNTER | INCURLOOC |
| FREQ RANGE 3GHz6GHZ | LOAD SEQ FROM DISC | PAUSE | PAUS | INCR LOOP COUNTER | DECRLOOC |
| HARMONIC MEAS | SPECIAL FUNCTIONS | MARKER→ CW | MARKCW | DECR LOOP COUNTER | IFLCEQCE |
| INSTRUMENT MODE | MORE | MORE | | IF LOOP COUNTER=0 | IFLCNEZE |
| SERVICE MENU | RETURN | RETURN | | IF LOOP COUNTER<>0 | |
| | | | | RETURN | |

| SEQUENCING MENU | DO SEQUENCE | DECISION MAKING | | EMIT BEEP | EMIB |
|---|---|---|---|---|---|
| | NEW SEQ/ MODIFY SEQ | TITLE TO PRINTER | | TTL OUT HIGH | TTLOH |
| LIMIT MENU | DONE MODIFY | TITLE TO PWMTR/HPIB | | TTL OUT LOW | TTLOL |
| TRANSFORM MENU | STORE SEQ TO DISC | WAITX | | REMEMBER MENUS | REMM |
| FREQ RANGE 3GHz6GHZ | LOAD SEQ FROM DISC | PAUSE | | DO EXT. TRIG | DOEXTT |
| HARMONIC MEAS | SPECIAL FUNCTIONS | MARKER→ CW | | PHSLK TRIG on OFF | PHSLTRIGNON PHSLTRIGOFF |
| INSTRUMENT MODE | MORE | MORE | | | |
| SERVICE MENU | RETURN | RETURN | | RETURN | |

| SEQUENCING MENU | LIMIT LINE on OFF | | |
|---|---|---|---|
| | | LIMILINEON, LIMILINEOFF | |
| | LIMIT TEST on OFF | LIMITESTON, LIMITESTOFF | |
| LIMIT MENU | BEEP FAIL on OFF | BEEPFAILON, BEEPFAILOFF | |
| TRANSFORM MENU | | | |
| FREQ RANGE 3GHz6GHz | EDIT LIMIT LINE | EDITLIML | |
| HARMONIC MEAS | | | |
| INSTRUMENT MODE | LIMIT LINE OFFSETS | LIMISTIO, LIMIAMPO, LIMIMAOF | |
| SERVICE MENU | RETURN | | |

| SEQUENCING MENU | LIMIT LINE on OFF | SEGMENT | | |
|---|---|---|---|---|
| | LIMIT TEST on OFF | | | |
| LIMIT MENU | BEEP FAIL on OFF | EDIT | SEDI | |
| TRANSFORM MENU | | DELETE | SDEL | |
| FREQ RANGE 3GHz6GHz | EDIT LIMIT LINE | ADD | SADD | |
| HARMONIC MEAS | | | | |
| INSTRUMENT MODE | LIMIT LINE OFFSETS | LIMIT TYPE | LIMTFL, LIMTSL, LIMTSP | |
| SERVICE MENU | RETURN | DONE | EDITDONE | |

| SEQUENCING MENU | LIMIT LINE on OFF | SEGMENT | STIMULUS VALUE | LIMS |
|---|---|---|---|---|
| | LIMIT TEST on OFF | | MARKER→ STIMULUS | MARKSTIM |
| LIMIT MENU | BEEP FAIL on OFF | EDIT | UPPER LIMIT | LIMU |
| TRANSFORM MENU | | DELETE | LOWER LIMIT | LIML |
| FREQ RANGE 3GHz6GHz | EDIT LIMIT LINE | ADD | DELTA LIMITS | LIMD |
| HARMONIC MEAS | | | MIDDLE VALUE | LIMM |
| INSTRUMENT MODE | LIMIT LINE OFFSETS | LIMIT TYPE | MARKER→ MIDDLE | MARKMIDD |
| SERVICE MENU | RETURN | DONE | DONE | SDON |

| SEQUENCING MENU | TRANSFORM on OFF | | WINDOW: MAXIMUM | MAXI |
|---|---|---|---|---|
| | SET FREQ LOW PASS | SETF | NORMAL | WINDNORM |
| LIMIT MENU | LOW PASS IMPULSE | LOWPIMPU | MINIMUM | WINDMINI |
| TRANSFORM MENU | LOW PASS STEP | LOWPSTEP | USE MEMORY on OFF | WINDUSEMON, WINDUSEMOFF |
| FREQ RANGE 3GHz6GHz | BANDPASS | BANDPASS | DEMOD: OFF | DEMOOFF |
| HARMONIC MEAS | WINDOW | | AMPLITUDE | DEMOAMPL |
| INSTRUMENT MODE | SPECIFY GATE | | PHASE | DEMOPHAS |
| SERVICE MENU | RETURN | | RETURN | |

| SEQUENCING MENU | TRANSFORM on OFF | | GATE on OFF | GATEON, GATEOFF |
|---|---|---|---|---|
| | SET FREQ LOW PASS | | GATE: START | GATESTAR |
| LIMIT MENU | LOW PASS IMPULSE | | STOP | GATESTOP |
| TRANSFORM MENU | LOW PASS STEP | | CENTER | GATECENT |
| FREQ RANGE 3GHz6GHz | BANDPASS | | SPAN | GATESPAN |
| HARMONIC MEAS | WINDOW | | | |
| INSTRUMENT MODE | SPECIFY GATE | | GATE SHAPE | |
| SERVICE MENU | RETURN | | RETURN | |

| SEQUENCING MENU | HARMONIC OFF | HARMOFF | SEQUENCING MENU | NETWORK ANALYZER | INSMNETA |
|---|---|---|---|---|---|
| | SECOND | HARMSEC | | EXT SOURCE AUTO | INSMEXSA |
| LIMIT MENU | THIRD | HARMTHIR | LIMIT MENU | EXT SOURCE MANUAL | INSMEXSM |
| TRANSFORM MENU | | | TRANSFORM MENU | TUNED RECEIVER | INSMTUNR |
| FREQ RANGE 3GHz6GHz | | | FREQ RANGE 3GHz6GHz | | |
| HARMONIC MEAS | | | HARMONIC MEAS | FREQ OFFS on OFF | FREQOFFSON FREQOFFSOFF |
| INSTRUMENT MODE | | | INSTRUMENT MODE | OFFSET VALUE | OFFV |
| SERVICE MENU | RETURN | | SERVICE MENU | RETURN | |

Appendix B

```
M68KL,P, "seq"
BEGIN

COMMENT    The following group of files form ccmddecl    ;
#FILE cdtmgr.bork;
#FILE ccmdcase.bork;
#FILE cresp.bork;
#FILE cstim.bork;
#FILE cparams.bork;
#FILE cformat.bork;
#FILE cdommenu.bork;
#FILE ccalmenu.bork;
#FILE cstdmenu.bork;
#FILE cdisp.bork;
#FILE clist.bork;
#FILE cplot.bork;
#FILE cmkr.bork;
#FILE csys.bork;
#FILE csrvc.bork;
#FILE cdisplay.bork;     & st_text &

#FILE kseq.bork;
#FILE cseq.bork;      & last sequence function constants, blankstr &
#FILE cscreen2.bork;     & sk_... constants &
#FILE cmessag0.bork;   & general warning messages &
#FILE cscrinit.bork;   & sequence display addresses &
#FILE cmemmgr1.bork;

#FILE fchdata1.bork;     & p_seq_title &
#FILE fmemmgr.bork;      & mem_stolen, release_mem, memory ids &
#FILE fmemmgr5.bork;
#FILE ftpmgr2.bork;      & eraseDisp &
#FILE fdisplay.bork;     & primitive display routines &
#FILE futil3.bork;     & warn, beepDone &
#FILE fmenu.bork;      & gen_menu,present_menu,prior_menu &
#FILE fcommand.bork;     & abortCmd &
#FILE ffifo.bork;      & wrt_ff &
#FILE ffifos.bork;     & token_ff,seq_ff &
#FILE fkernel.bork;    & acquire, release &
#FILE fscreen0.bork;     & print_str &
#FILE fkbd.bork;       & wrt_fp &
#FILE fkernel4.bork;    & signal_init, awaited &
#FILE fkernel3.bork;    & pause &
#FILE fstring.bork;    & app_ch, i_str &
#FILE fiomap.bork;     & dgram &
#FILE fcmos.bork;      & cmosSeq &
#FILE fstds3.bork;     & calKitLabel,std_class_title,standard_title&
#FILE fskey1.bork;      & hiliteMax &
#FILE fscreen1.bork;     & e_ary &
#FILE fchdata6.bork;    & seq_title &
#FILE fskey.bork;       & LBL_INDEX, SK_LABEL &
#FILE fmain.bork;       & dropPriority &
#FILE flimit.bork;     & limit_fail &
#FILE fchdata.bork;    & curr_e_ch &
#FILE fdatamgr.bork;    & recall_preset_state &
#FILE fprint.bork;     & wr_print, print_det &
#FILE ftitle.bork;     & title_seq  title_actf   expandTitle &
#FILE fcontib4.bork;    & askForCont &
#FILE ffmt.bork;       & fmt_int &
#FILE ftlib.bork;      & remote &
#FILE fdirty.bork;     & wait_both &
#FILE fdisc2.bork;     & cmpStr &
```

FILE ctok.bork;    & compatible token translation table &

GLOBAL INTEGER lastSeqFun;
     & offset into seq memory where next token is placed &
INTEGER seq_entry;
DOUBLE seq_act_addr;   & first address of sequence memory &
  & number of sequence that is running &
INTEGER doing_seq_num;

& variables used by seqTutor routine &
INTEGER dga;  & display memory address &
INTEGER y_pos;

& number of sequence to copy tokens out of &
INTEGER dup_from_num;

COMMENT   Remember where to continue in sequence
          if pause/continue was encountered.  ;
INTEGER pause_item_indx;
   & if pause_seq_num = 0 then no sequence is paused &
   & num represents paused sequence &
GLOBAL INTEGER pause_seq_num;
COMMENT     modify_sequence_number = 0 if no sequence is being modified
                                   = n if sequence n is being modified ;
GLOBAL INTEGER mod_seq_num;
   & if rem_menu is true then mod sequence does read in and &
   & store all menu keys following one hard key press &
GLOBAL INTEGER rem_menu;
INTEGER CONSTANT max_seq_entry := (seq_size/2)-1;

& line number in sequence edit list where next entry will go &
INTEGER CONSTANT entry_line_num := 8;

& last sequence modification line &
INTEGER CONSTANT max_seq_line       := 19;   & without title function &
INTEGER CONSTANT max_seq_line_titl := 12;    & with title function &
       & first sequence modification line &
INTEGER CONSTANT min_seq_line       := 1;    & without title function &
INTEGER CONSTANT min_seq_line_titl := 4;     & with title function &

INTEGER CONSTANT seq_line_sz  := title_size+2,
                 seq_line_ofs := title_size+2+title_size+2;
GLOBAL INTEGER loop_cntr;
GLOBAL REAL wait_timer;

BOOLEAN PROCEDURE seq_empty ( num );
  VALUE num; INTEGER num;                                FORWARD;

& ASCII character constants &
    & pad character to force even number of bytes into active func numb&
BYTE CONSTANT pad_char := ' ,
              space    := ' ,
              zero     := '0,
              nine     := '9,
              decpt    := '.,
              minus    := '-;

COMMENT   active function terminator suffixes
          The units are determined by the last active
          function in the sequence.  ;
ALPHA TABLE suffix_table.L := "x1",
                              "x1",
                              "x1",
                              "k/m",
                              "M/u",
                              "G/n",
                              "   ",
                              "   ";

```
                                     & this table is also in stitle   &
INTEGER TABLE title_display_bl.L :=
    0,
    title_display,
    title2_display;

COMMENT
    Within this module selected fifo writes will not
    occur if the fifo is full.
    This is done to prevent possible deadlocks
    from occurring during sequence modification. If
    the user is scrolling quickly through a sequence
    list, then both the sequence and token fifos
    become full and then it is possible that either
    the command or doSequ processes can become
    permanently suspended because they are waiting
    for a fifo to partially empty.      ;

#EJECT;                                                                turn_on_ptr
COMMENT                                                                turn_off_ptr

**********************************************************************

Turn on or off the sequence entry pointer on the CRT

**********************************************************************
;
SUBROUTINE turn_on_ptr;
BEGIN
    lb (seq_ptr_disp,   "="+127);
    lb (seq_ptr_disp+4, "="+127);    & write twice to increase intensity &
END;

SUBROUTINE turn_off_ptr;
BEGIN
    lb (seq_ptr_disp,   "  ");
    lb (seq_ptr_disp+4, "  ");
END;

#EJECT;
COMMENT                                                                goto_next_item
**********************************************************************

Set item index to point to next item in a sequence list.
        Normally a sequence item is an integer size token. But
        an active function number can also be an item. The number
        can range in size from a few bytes to about 50 bytes.
        The item_count parameter is number that is incremented by
        one. The item_index is a number used in conjunction with
        an integer pointer to fetch sequence data. It is incremented
        by the number of integers found in the item. Assume
        active function numbers contain an even number of bytes.
            No incrementing is done if at end of sequence.

**********************************************************************
;
PROCEDURE goto_next_item(item_count,item_indx);
    INTEGER item_count,item_indx;
BEGIN
    INTEGER POINTER iptr;
    INTEGER token;
```

```
    STPNTR (iptr, seq_act_addr);
    token := iptr[item_indx];

& if at end of sequence then don't goto next item &
    IF token = Cseq_stop THEN
    BEGIN     END ELSE IF token = Cfunc_num THEN
    BEGIN   & active function number &
       item_indx := item_indx + 1;
       WHILE iptr[item_indx] <> Cfunc_num DO
           item_indx := item_indx + 1;
       item_indx := item_indx + 1;
       item_count := item_count + 1;
    END ELSE IF token = Ctitl_str THEN
    BEGIN   & title string &
       item_indx := item_indx + 1;
       WHILE iptr[item_indx] <> Ctitl_str DO
           item_indx := item_indx + 1;
       item_indx := item_indx + 1;
       item_count := item_count + 1;
    END ELSE
    BEGIN  & normal token &
       item_count := item_count + 1;
       item_indx := item_indx + 1;
    END;
       & check if item_indx has gone outside the sequence list limits &
    IF item_indx < 0 THEN item_indx := 0;

IF item_indx > max_seq_entry THEN item_indx := max_seq_entry;
END goto_next_item;

COMMENT                                                        goto_prev_item
*****************************************************************************

Set item index to point to previous item in a sequence list.
       Normally a sequence item is an integer size token. But
       an active function number can also be an item. The number
       can range in size from a few bytes to about 50 bytes.
       The item_count parameter is number that is decremented by
       one. The item_index is a number used in conjunction with
       an integer pointer to fetch sequence data. It is decremented
       by the number of integers found in the item. Assume
       active function numbers contain an even number of bytes.
          No decrementing is done if at beginning of sequence.

*****************************************************************************
;
PROCEDURE goto_prev_item(item_count,item_indx);
   INTEGER item_count,item_indx;
BEGIN
   INTEGER POINTER iptr;
   INTEGER token;

STPNTR (iptr, seq_act_addr);
   token := iptr[item_indx];
```

```
        & if at start of sequence then don't goto previous item &
IF token = Cseq_start THEN
BEGIN      END ELSE
BEGIN
      & assume previous item is normal token &
   item_indx := item_indx - 1;
   item_count := item_count - 1;
   token := iptr[item_indx];

IF token = Cfunc_num THEN
   BEGIN   & prev item is active function number &
      item_indx := item_indx - 1;
      WHILE iptr[item_indx] <> Cfunc_num DO
         item_indx := item_indx - 1;
   END;

IF token = Ctitl_str THEN
   BEGIN   & prev item is title string &
      item_indx := item_indx - 1;
      WHILE iptr[item_indx] <> Ctitl_str DO
         item_indx := item_indx - 1;
   END;

END;
   & check if item_indx has gone outside the sequence list limits &

IF item_indx < 0 THEN item_indx := 0;
   IF item_indx > max_seq_entry THEN item_indx := max_seq_entry;
END goto_prev_item;

#EJECT;
COMMENT                                                        lbSeq
******************************************************************

Write a string into a sequence display area.
     The string is written twice to make it stand out
     from the background trace and graticule.

******************************************************************
;
PROCEDURE lbSeq(addr,string);
   VALUE addr,string;
   INTEGER addr;
   ALPHA string;
 BEGIN
      lb (addr, blankstr);
      lb (addr, string);
      lb (addr+seq_line_sz, blankstr);
      lb (addr+seq_line_sz, string);
 END lbSeq;

COMMENT                                                    clrSeqDisp
******************************************************************

Clear out all of the sequence display areas
     If the sequence is not being modified.

******************************************************************
;
```

```
SUBROUTINE clrSeqDisp;                                    ENTRY;
  BEGIN
     IF mod_seq_num = 0 THEN
     BEGIN
        turn_off_ptr;    & sequence entry pointer on CRT &
        lbSeq (seq_disp1, blankstr);
        lbSeq (seq_disp2, blankstr);
        lbSeq (seq_disp3, blankstr);

lbSeq (seq_ed_disp1, blankstr);
        lbSeq (seq_ed_disp2, blankstr);
        lbSeq (seq_ed_disp3, blankstr);
        lbSeq (seq_ed_disp4, blankstr);
        lbSeq (seq_ed_disp5, blankstr);
        lbSeq (seq_ed_disp6, blankstr);
        lbSeq (seq_ed_disp7, blankstr);
        lbSeq (seq_ed_disp8, blankstr);
        lbSeq (seq_ed_disp9, blankstr);
        lbSeq (seq_ed_disp10, blankstr);
        lbSeq (seq_ed_disp11, blankstr);
        lbSeq (seq_ed_disp12, blankstr);
        lbSeq (seq_ed_disp13, blankstr);
        lbSeq (seq_ed_disp14, blankstr);
        lbSeq (seq_ed_disp15, blankstr);
        lbSeq (seq_ed_disp16, blankstr);
        lbSeq (seq_ed_disp17, blankstr);
        lbSeq (seq_ed_disp18, blankstr);
        lbSeq (seq_ed_disp19, blankstr);
     END;

END clrSeqDisp;

#EJECT;
COMMENT                                                      autoSeq
**********************************************************************

Start up the first sequence in the instrument with the
      title "AUTO". The title must be in uppercase letters.

**********************************************************************
;
PROCEDURE autoSeq;                                         ENTRY;
BEGIN
   BYTE POINTER bptr;
   INTEGER num;
   BOOLEAN match;

num := 1;
   match := FALSE;
   WHILE NOT match AND num<=max_seq_num  DO
   BEGIN
         & examine title of each sequence &
      STPNTR (bptr, ADRS(seq_title[num,0]));
      match := cmpStr ("AUTO",bptr);
      num := num + 1;
   END;
   num := num - 1;
   IF match THEN
   BEGIN
         COMMENT
            If a non-empty AUTOSTART sequence was found then start
            it running by sending the do sequence token to
            the doSequ process.      ;
      IF NOT seq_empty (num) THEN wrt_ff( seq_ff, num );
   END;
END autoSeq;
```

```
EJECT;
COMMENT                                                              disp_item
****************************************************************************
    Take one line item from the sequence and place on CRT or printer.
    The line_indx passed to the routine indicates which CRT
    line to display the item. The item_indx is the offset into
    the sequence memory where the item is stored. In the case
    of a token, only one integer is read and looked up in a
    mnemonic table. The mnemonic is then displayed. In the case
    of an active function number, all of the digits in the active
    number string are displayed. In the case of a title string
    all of the characters are displayed.
       Special messages are displayed for Cseq_start and Cseq_stop.
       The variable seq_act_addr must contain the first address
    of the sequence list from which items are fetched. The variable
    lastSeqFun must contain the last kind of sequence activity
    chosen by the user.

****************************************************************************
;
PROCEDURE disp_item( line_indx, item_indx );
   VALUE line_indx, item_indx; INTEGER line_indx,item_indx;
BEGIN
   INTEGER i;
   INTEGER charIndex;
   INTEGER POINTER iptr, item_ptr;
   INTEGER token;
   BYTE POINTER act_fun_ptr;
   ALPHA mnemstr, mnemstr2, mnemstr3;
   BYTE POINTER bptr = mnemstr;
   BYTE POINTER bptr2 = mnemstr2;
   BYTE POINTER bptr3 = mnemstr3;
   BYTE ARRAY mnem_str2 [-1:title_size];
   BYTE special,special2;

STPNTR (bptr2, ADRS(mnem_str2));
   bptr2[-1] := title_size;
   bptr2[0] := 0;
   STPNTR (item_ptr ,seq_act_addr);

IF (item_indx >= 0) AND (item_indx < max_seq_entry) THEN
   BEGIN
      token := item_ptr[item_indx];
   END
   ELSE
      token := -1;  & index is outside of sequence memory &

IF token = -1 THEN
   BEGIN
      mnemstr2 := blankstr;   & display nothing &
   END ELSE IF token = Cfunc_num THEN
   BEGIN   & display active function number &
      item_indx := item_indx + 1;
      STPNTR (act_fun_ptr,seq_act_addr);
      STPNTR (iptr,seq_act_addr);
      charIndex := 2 * item_indx;
      bptr2[0] := 0;   & clear mnemstr2 &

& fetch active function number string &
      FOR i := 0 TO act_fun_ptr[charIndex] DO
         bptr2[i] := act_fun_ptr[charIndex+i];
         & fetch terminator token &
      token := iptr[item_indx + (act_fun_ptr[charIndex]+1)/2];
```

```
          & append terminator notation &
        app_str (mnemstr2, suffix_table[token-C_enter]);
    END ELSE IF token = Ctitl_str THEN
    BEGIN   & display title string &
        item_indx := item_indx + 1;
        STPNTR (act_fun_ptr,seq_act_addr);
        charIndex := 2 * item_indx;
        bptr2[0] := 0;  & clear mnemstr2 &
        app_ch (mnemstr2, " ");  & push title string one char to the right&

& fetch title string from sequence memory &
        bptr2[0] := act_fun_ptr[charIndex] + 1;
        FOR i := 1 TO act_fun_ptr[charIndex] DO
            bptr2[i+1] := act_fun_ptr[charIndex+i];
                & substitute special symbols with strings &
        expandTitle (mnemstr2,FALSE);
    END ELSE IF token = Cboolean1 THEN
    BEGIN
        IF item_ptr[item_indx-1] = Cpl_scl THEN
            mnemstr2 := " GRAT"
        ELSE IF item_ptr[item_indx-1] = Cpl_spd THEN
            mnemstr2 := " FAST"
        ELSE
            mnemstr2 := " ON";
    END ELSE IF token = Cboolean0 THEN
    BEGIN
        IF item_ptr[item_indx-1] = Cpl_scl THEN
            mnemstr2 := " FULL"
        ELSE IF item_ptr[item_indx-1] = Cpl_spd THEN
            mnemstr2 := " SLOW"
        ELSE
            mnemstr2 := " OFF";
    END ELSE
    BEGIN      & display soft key label for token &
        COMMENT
            The command token is an index into the table LBL_INDEX.
            LBL_INDEX contains index pairs. The index pairs point to
            soft key label strings in the table SK_LABEL. The first
    element of the pair points to the string forming the
    first line of the soft key label while the second element
    points to the second line of the soft key label.
    Tokens greater than or equal to Cmkrval are hard keys
    and thus have no soft key labels.
;

IF token < 0 OR token >= Cmkrval THEN
BEGIN
    & There is no soft key label associated with token &
    IF token = Cseq_start THEN
        mnemstr2 := "Start of Sequence"
    ELSE IF token = Cseq_stop THEN
    BEGIN
           & i contains number of remaining bytes &
        i := 2*(max_seq_entry - item_indx);
```

```
            & convert the integer i to an ASCII string &
        mnemstr2 := fmt_int (i,mnemstr2,%01000500);
        app_str (mnemstr2,
            " empty bytes available");
    END
    ELSE IF token = Centry_off THEN
        mnemstr2 := "ENTRY OFF"
    ELSE IF token = Cch1 THEN
        mnemstr2 := "CH 1"
    ELSE IF token = Cch2 THEN
        mnemstr2 := "CH 2"
    ELSE IF token < 0 THEN
        mnemstr2 := "Number Entry Key"
    ELSE IF token = Clocal THEN
        mnemstr2 := "LOCAL"
    ELSE IF token>=Csave AND token<=Csys_menu THEN
        mnemstr2 := "MENU"
    ELSE
            & could not find a soft key label,print ? &
        mnemstr2 := "Say What?";
END
ELSE
BEGIN
    & token has a soft key label &
    bptr2[0] := 0;    & clear mnemstr2 &
        & First check if soft key has an unusual label &
    IF token = Csave_1 THEN
        app_str( mnemstr2,"SAVE 1")
    ELSE IF token = Csave_2 THEN
        app_str( mnemstr2,"SAVE 2")
    ELSE IF token = Csave_3 THEN
        app_str( mnemstr2,"SAVE 3")
    ELSE IF token = Csave_4 THEN
        app_str( mnemstr2,"SAVE 4")
    ELSE IF token = Csave_5 THEN
        app_str( mnemstr2,"SAVE 5")
    ELSE IF token = Crecall_1 THEN
        app_str( mnemstr2,"RECALL 1")
    ELSE IF token = Crecall_2 THEN
        app_str( mnemstr2,"RECALL 2")
    ELSE IF token = Crecall_3 THEN
        app_str( mnemstr2,"RECALL 3")
    ELSE IF token = Crecall_4 THEN
        app_str( mnemstr2,"RECALL 4")
    ELSE IF token = Crecall_5 THEN
        app_str( mnemstr2,"RECALL 5")
    ELSE IF token = Csave_ext1 THEN
        app_str( mnemstr2,"STORE 1")
    ELSE IF token = Csave_ext2 THEN
        app_str( mnemstr2,"STORE 2")
    ELSE IF token = Csave_ext3 THEN
        app_str( mnemstr2,"STORE 3")
    ELSE IF token = Csave_ext4 THEN
        app_str( mnemstr2,"STORE 4")
    ELSE IF token = Csave_ext5 THEN
        app_str( mnemstr2,"STORE 5")
    ELSE IF token = Crecall_ext1 THEN
        app_str( mnemstr2,"LOAD 1")
    ELSE IF token = Crecall_ext2 THEN
        app_str( mnemstr2,"LOAD 2")
    ELSE IF token = Crecall_ext3 THEN
        app_str( mnemstr2,"LOAD 3")
    ELSE IF token = Crecall_ext4 THEN
        app_str( mnemstr2,"LOAD 4")
    ELSE IF token = Crecall_ext5 THEN
        app_str( mnemstr2,"LOAD 5");
```

```
IF token = Cmarker_1 THEN
    app_str( mnemstr2,"MARKER 1")
ELSE IF token = Cmarker_2 THEN
    app_str( mnemstr2,"MARKER 2")
ELSE IF token = Cmarker_3 THEN
    app_str( mnemstr2,"MARKER 3")
ELSE IF token = Cmarker_4 THEN
    app_str( mnemstr2,"MARKER 4")
ELSE IF token = Charm_2 THEN
    app_str( mnemstr2,"HARMONIC SECOND")
ELSE IF token = Charm_3 THEN
    app_str( mnemstr2,"HARMONIC THIRD")
ELSE IF (token>=Cseq_1) AND (token<=Cseq_6) THEN
BEGIN
    app_str( mnemstr2," SEQUENCE ");
    app_ch( mnemstr2,token-Cseq_1+'1');
END
ELSE IF (token>=Cst_seq1) AND
        (token<=Cst_seq1+max_seq_num-1) THEN
BEGIN
    app_str( mnemstr2,"STORE SEQUENCE ");
    app_ch( mnemstr2,token-Cst_seq1+'1');
END
ELSE IF (token>=Cld_seq1) AND
        (token<=Cld_seq1+max_seq_num-1) THEN
BEGIN
    app_str( mnemstr2,"LOAD SEQUENCE ");
    app_ch( mnemstr2,token-Cld_seq1+'1');
END
ELSE IF token = Cstart THEN
    app_str( mnemstr2,"START")
ELSE IF token = Csearch_off THEN
    app_str( mnemstr2,"SEARCH OFF")
ELSE IF token = Cmkr_to_max THEN
    app_str( mnemstr2,"SEARCH MAX")
ELSE IF token = Cmkr_to_min THEN
    app_str( mnemstr2,"SEARCH MIN")
ELSE IF token = Csearch_target THEN
    app_str( mnemstr2,"SEARCH TARGET")
ELSE IF token = Cseq_limp THEN
    app_str( mnemstr2,"IF LIMIT TEST PASS THEN DO")
ELSE IF token = Cseq_limf THEN
    app_str( mnemstr2,"IF LIMIT TEST FAIL THEN DO")
ELSE IF token = Cseq_lpcz THEN
    app_str( mnemstr2,"IF LOOP COUNTER = 0 THEN DO")
ELSE IF token = Cseq_lpcnz THEN
    app_str( mnemstr2,"IF LOOP COUNTER <> 0 THEN DO")
ELSE IF token = Cquad_11 THEN
    app_str( mnemstr2,"PLOT QUADRANT: UPPER LEFT")
ELSE IF token = Cquad_21 THEN
    app_str( mnemstr2,"PLOT QUADRANT: LOWER LEFT")
ELSE IF token = Cquad_12 THEN
    app_str( mnemstr2,"PLOT QUADRANT: UPPER RIGHT")
ELSE IF token = Cquad_22 THEN
    app_str( mnemstr2,"PLOT QUADRANT: LOWER RIGHT")
ELSE IF token = Cquad_full THEN
    app_str( mnemstr2,"PLOT FULL PAGE")
ELSE IF token = Cs12 THEN
    app_str( mnemstr2,"Trans: REV S12")
ELSE IF token = Cs22 THEN
    app_str( mnemstr2,"Refl: REV S22")
ELSE IF token = Cconv_off THEN
    app_str( mnemstr2,"CONVERSION:OFF");
```

```
       IF bptr2[0] = 0 THEN
       BEGIN  & soft key does not have an unusual label &
          & examine first and second soft key lines &
                & get first string &
          app_str (mnemstr2 ,SK_LABEL[LBL_INDEX[(token-1)*2]]);
          mnemstr := SK_LABEL[LBL_INDEX[((token-1)*2)+1]];
          IF (bptr[1]>="A" AND bptr[1]<="Z") OR
              (bptr[1]>=%30 AND bptr[1]<="9") THEN
          BEGIN
              &if second line is reasonable then append to first line &
              app_ch (mnemstr2, " ");
              app_str (mnemstr2, SK_LABEL[LBL_INDEX[((token-1)*2)+1]]);
          END;

& check for special second soft key lines of calib. keys &
          &   This code is is similar to code in routine h_menu &
          IF (token <= hiliteMax) THEN   &range check max hilite bits&
          BEGIN
              mnemstr3 := SK_LABEL[LBL_INDEX[2*token-1]];
              special := bptr3[1];
              app_ch (mnemstr2, " ");
                    IF  special = sk_cal_kit THEN
                        app_str(mnemstr2, calKitLabel)

ELSE IF ( special >= sk_port1_std1 ) AND
                            ( special <= sk_2T_ofs ) THEN
                       app_str(mnemstr2,std_class_title(special-sk_port1_std1))

ELSE IF ( special >= sk_class_std1 ) AND
                            ( special <= sk_class_std8 ) THEN
                       app_str(mnemstr2,standard_title(special-sk_class_std1+1))

ELSE IF special = sk_cur_class THEN
                        app_str(mnemstr2, currClassLabel);

END;

END;
       END;
    END;

IF lastSeqFun = print_seq THEN
    BEGIN   & send the item string to the printer &
        wr_print (mnemstr2);
        wr_print (13+10);    & CR LF &
    END
    ELSE
    BEGIN   & send the item string to the CRT  &
        IF    line_indx >= min_seq_line
          AND line_indx <= max_seq_line THEN
            lbSeq (seq_ed_displ + ((line_indx-1)*seq_line_ofs), mnemstr2);
    END;

END disp_item;
```

```
EJECT;
COMMENT
                                                                     disp_seq_list
**************************************************************************
    Displays as many items in the sequence memory list as
    possible. The input parameter "entry_indx" is the array
    index of the item in the list to be displayed on the entry
    line (line with arrow).
       The sequence list is first constructed on the screen
    from the entry line to the bottom of the list window.
    Then the list is constructed from the line above the entry
    line up to the top of the list window.

**************************************************************************
;
PROCEDURE disp_seq_list( entry_indx );
 VALUE entry_indx; INTEGER entry_indx;
 BEGIN
   INTEGER POINTER iptr;
   INTEGER line_indx, token_indx, line_indx2;
   INTEGER min_seq_line_num, max_seq_line_num;

STPNTR (iptr ,seq_act_addr);
   IF title_actf THEN
   BEGIN
      min_seq_line_num := min_seq_line_titl;
      max_seq_line_num := max_seq_line_titl;
   END
   ELSE
   BEGIN     & no title active function &
      min_seq_line_num := min_seq_line;
      max_seq_line_num := max_seq_line;
   END;

& construct sequence list below and including entry line &
   token_indx := entry_indx;
   line_indx := entry_line_num;
   WHILE line_indx <= max_seq_line_num
     AND iptr[token_indx] <> Cseq_stop DO
   BEGIN
      disp_item (line_indx, token_indx);
      goto_next_item (line_indx, token_indx);
   END;
   IF iptr[token_indx]=Cseq_stop THEN disp_item (line_indx,token_indx);

IF line_indx < max_seq_line THEN
   BEGIN
      & clear remaining lines below entry line &
      FOR line_indx2 := line_indx+1 TO max_seq_line DO
         lbSeq (seq_ed_displ +((line_indx2-1)*seq_line_ofs),blankstr);
   END;

& construct sequence list above entry line &
   token_indx := entry_indx;
   line_indx := entry_line_num;
   goto_prev_item (line_indx, token_indx);
   WHILE line_indx >= min_seq_line_num
     AND iptr[token_indx] <> Cseq_start DO
   BEGIN
      disp_item (line_indx, token_indx);
      goto_prev_item (line_indx, token_indx);
   END;
   IF iptr[token_indx]=Cseq_start THEN disp_item (line_indx,token_indx);
```

```
           IF line_indx > min_seq_line THEN
           BEGIN
              & clear remaining lines above entry line &
              FOR line_indx2 := line_indx-1 STEP -1 UNTIL min_seq_line DO
                 lbSeq (seq_ed_displ +((line_indx2-1)*seq_line_ofs),blankstr);
           END END disp_seq_list;

EJECT;
        COMMENT                                                          seqMsg
        ****************************************************************

Write the appropriate sequence message at the top
              of the CRT. Also display the sequence list if modifying.

****************************************************************
        ;
        PROCEDURE seqMsg;                                  ENTRY;
        BEGIN
           ALPHA seq_str;
           BYTE POINTER sptr = seq_str;
           BYTE ARRAY seqstr[-1:title_size];

STPNTR (sptr, ADRS(seqstr));
           i_str (seq_str,title_size);
              & write Doing Sequence message &
           IF doing_seq_num <> 0 THEN
           BEGIN
              IF doing_seq_num = max_seq_num THEN
                 seq_act_addr := ADRS(cmosSeq)
              ELSE
                 seq_act_addr := mem_id_addr[seq_id_1+doing_seq_num-1];
              app_str (seq_str, "DOING SEQUENCE ");
                 & append sequence title to DOING SEQUENCE string &
              app_str (seq_str, seq_title[doing_seq_num,0]);
              app_str (seq_str, ", PRESS LOCAL TO ABORT SEQUENCE");
              lbSeq (seq_displ, seq_str);   & print string &
           END;

& write Modify Sequence message &
           IF mod_seq_num <> 0 THEN
           BEGIN
              IF mod_seq_num = max_seq_num THEN
                 seq_act_addr := ADRS(cmosSeq)
              ELSE
                 seq_act_addr := mem_id_addr[seq_id_1+mod_seq_num-1];
              turn_on_ptr;
              app_str (seq_str ,"MOD SEQUENCE ");
                 &  append the sequence title to the MOD SEQ string &
              app_str (seq_str, seq_title[mod_seq_num,0]);
              app_str (seq_str, ": press DONE MODIFY to stop");
              lbSeq (seq_displ, seq_str);
              lbSeq (seq_disp2,
                 "BACK SP DELETES, RPG OR STEP KEYS MOVE LIST");
                 & print the current sequence list &
              disp_seq_list(seq_entry);
           END;
        END seqMsg;
```

```
EJECT;
COMMENT                                                              seq_empty
*********************************************************************
    Examine a sequence memory for meaningful command tokens.
    The procedure must first check if memory has been allocated
    to the sequence. Next if there exists a memory block, then
    the routine must check if it contains tokens other than
    sequence_start and sequence_end. If the sequence does not
    exist or does not have any meaningful tokens then TRUE is
    returned otherwise FALSE is returned.
    The input parameter "num" represents the sequence to be
    checked. 1 through max_seq_num-1 are sequences residing in
    allocatable memory while sequence max_seq_num resides in CMOS
    (non-volatile) memory.

*********************************************************************
;
BOOLEAN PROCEDURE seq_empty ( num );
 VALUE num; INTEGER num;                                        ENTRY;
 BEGIN
   BOOLEAN new_alloc, empty;
   INTEGER POINTER iptr;
   DOUBLE seq_addr;
   INTEGER i;

empty := TRUE;
   IF num = max_seq_num THEN
   BEGIN
      seq_addr := ADRS(cmosSeq);
      STPNTR (iptr , seq_addr);
      new_alloc := iptr[0] <> Cseq_start;
   END
   ELSE
      new_alloc := mem_stolen (seq_addr,seq_id_1+num-1,seq_size);
   IF (seq_addr <> 0) AND (NOT new_alloc) THEN
   BEGIN   & there is an existing sequence &
      STPNTR (iptr , seq_addr);
      IF iptr[0] = Cseq_start AND iptr[1] <> Cseq_stop THEN
         empty := FALSE;
         & sequence isn't empty because it has tokens other than &
         & sequence start and sequence stop &
   END
   ELSE
      IF num <> max_seq_num THEN release_mem (seq_id_1+num-1);
   seq_empty := empty;

END seq_empty;
```

EJECT;
COMMENT                                                          translate_seq
*****************************************************************************

Translate a sequence list to or from a list of 'compatible'
    tokens. These compatible tokens will never change and will
    correspond to values in the translate_token table. The
    tokens saved in the internel sequence lists can vary from
    one firmware revision to the next.
     The parameter 'to_disc' if set TRUE tell the routine to
    translate tokens from the 'num' sequence and place them in
    the sequence-to-disc buffer. If 'to_disc' is FALSE then the
    tokens flow from the disc buffer to the sequence.
     The routine returns TRUE if there is memory available
    for the sequence-to-disc buffer.

*****************************************************************************
;
BOOLEAN PROCEDURE translate_seq ( num,to_disc );
 VALUE num,to_disc; INTEGER num; BOOLEAN to_disc;                ENTRY;
BEGIN
    INTEGER POINTER dptr,sptr;
    DOUBLE seq_addr;
    INTEGER token_indx,i,j,srch_token;
    INTEGER item1,item2,dummy;

mem_stolen (seq_addr, seq_transl_id, seq_size);
    IF seq_addr <> 0 THEN
    BEGIN   & memory is available for sequence-to-disc buffer,&
        STPNTR (dptr , seq_addr);
          & get the address of the sequence &
        IF num = max_seq_num THEN
            seq_addr := ADRS(cmosSeq)
        ELSE
            mem_stolen (seq_addr, seq_id_1+num-1, seq_size);
        STPNTR (sptr , seq_addr);
        IF to_disc THEN
        BEGIN   & transfer tokens from sequence to disc buffer &
            dummy := 0;
            token_indx := 0;
            i := 0;
            DO BEGIN
                item1 := sptr[i];
                item2 := sptr[token_indx];
                IF (i=token_indx) OR (i=token_indx-1) THEN
                BEGIN   & a token was detected so translate &
                    & do a linear search of token translate to find token &
                    j := -1;
                    DO BEGIN
                        j := j + 1;
                        srch_token := token_translate[j];
                    END UNTIL srch_token=item1 OR srch_token=-1;
                    IF srch_token<>-1 THEN
                        item1 := j   & the token was found, do translation &
                    ELSE
                        item1 := Cnull;   & token not found &
                IF (i=token_indx) OR (i=token_indx-1) THEN
                BEGIN   & a token was detected so translate &
                    IF item1 < translate_tbl_sz THEN
                        item1 := token_translate [item1]
                    ELSE
                        & token from disc was not in translate table &
                        item1 := Cnull;

```
                & increment token index if same as i index &
            IF token_indx = i THEN
            BEGIN
                IF item2 = Cfunc_num_trans THEN
                BEGIN   & look for next token after act func number &
                    token_indx := token_indx + 1;
                    WHILE dptr[token_indx] <> Cfunc_num_trans DO
                        token_indx := token_indx + 1;
                    token_indx := token_indx + 1;
                END
                ELSE IF item2 = Ctitl_str_trans THEN
                BEGIN   & look for next token after title string &
                    token_indx := token_indx + 1;
                    WHILE dptr[token_indx] <> Ctitl_str_trans DO
                        token_indx := token_indx + 1;
                    token_indx := token_indx + 1;
                END
                ELSE
                    token_indx := token_indx + 1;
            END;

END
        ELSE
        BEGIN
            COMMENT
                No token was detected, only a string, so just
                transfer integer without translating (except
                for active function terminator tokens).
                ;
            IF dptr[token_indx-1] = Cfunc_num_trans AND
                dptr[token_indx-2] = item1 THEN
                    item1 := token_translate[item1];
        END;
        sptr[i] := item1;
        i := i + 1;    & increment integer index &
      END UNTIL item1 = Cseq_stop OR i = seq_size/2;
    END;
    translate_seq := TRUE;
  END
  ELSE
    translate_seq := FALSE;

END translate_seq;
                & increment token index if same as i index &
            IF token_indx = i THEN
            BEGIN
                IF item2 = Cfunc_num THEN
                BEGIN   & look for next token after act func number &
                    token_indx := token_indx + 1;
                    WHILE sptr[token_indx] <> Cfunc_num DO
                        token_indx := token_indx + 1;
                    token_indx := token_indx + 1;
                END
                ELSE IF item2 = Ctitl_str THEN
                BEGIN   & look for next token after title string &
                    token_indx := token_indx + 1;
                    WHILE sptr[token_indx] <> Ctitl_str DO
                        token_indx := token_indx + 1;
                    token_indx := token_indx + 1;
                END
                ELSE IF item2 = Cseq_stop THEN
                BEGIN
                    & don't increment token index if at end of list &
                END
```

```
                    ELSE
                        token_indx := token_indx + 1;
                END;

END
            ELSE
            BEGIN
                COMMENT
                    No token was detected, only a string, so just
                    transfer integer without translating (except
                    for active function terminator tokens).
                    ;
                IF sptr[token_indx-1] = Cfunc_num AND
                   sptr[token_indx-2] = item1 THEN
                BEGIN
                    j := -1;
                    DO BEGIN
                        j := j + 1;
                        srch_token := token_translate[j];
                    END UNTIL srch_token = item1 OR srch_token = -1;
                    item1 := j;
                END;
            END;
            dptr[i] := item1;
            i := i + 1;   & increment integer index &
        END UNTIL item1 = Cseq_stop OR i = seq_size/2;
    END
    ELSE
    BEGIN   & transfer tokens from disc buffer to sequence &
        token_indx := 0;
        i := 0;
        DO BEGIN
            item1 := dptr[i];
            item2 := dptr[token_indx];

#EJECT;
COMMENT                                                         prnt_seq
****************************************************************************

Prepare to send a listing of the selected sequence
    to the printer. The routine disp_item does most of
    the work. disp_item examines a sequence token, finds
    the corresponding soft key label and then prints the label.

****************************************************************************
;

PROCEDURE prnt_seq (num);
    VALUE num; INTEGER num;                                     ENTRY;
BEGIN
    INTEGER token_indx,dummy;
    INTEGER POINTER iptr;
    ALPHA seq_str;
    BYTE POINTER sptr = seq_str;
    BYTE ARRAY seqstr [-1:20];

IF print_det THEN
    BEGIN
        abortCmd  := FALSE;
        IF NOT seq_empty(num) THEN
        BEGIN   & continue if sequence contains some tokens &
            STPNTR (sptr, ADRS(seqstr));
            sptr[-1] := 20;
            sptr[0] := 0;
            app_str (seq_str, "SEQUENCE ");
```

```
                & fetch the sequence title &
            app_str (seq_str, seq_title[num,0]);
                & Print the sequence title &
            wr_print (seq_str);
            wr_print (13+10);    & CR LF &
            IF num = max_seq_num THEN
                seq_act_addr := ADRS(cmosSeq)
            ELSE
                seq_act_addr := mem_id_addr[seq_id_1+num-1];
            STPNTR (iptr,seq_act_addr);
            token_indx := 0;
                & print items until the end of sequence or until the &
                & user stops the printing by pressing LOCAL &
            WHILE iptr[token_indx] <> Cseq_stop AND NOT abortCmd DO
            BEGIN
                disp_item (dummy,token_indx);
                goto_next_item (dummy,token_indx);
            END;
        END
        ELSE
            warn (empty_seq);
    END;
    gen_menu (prior_menu);
END;       & prnt_seq &

#EJECT;
COMMENT                                                           sel_seq
******************************************************************************

Select a sequence for a previously chosen function.
    Normally the user will press a sequence function key
    like "PRINT SEQUENCE". The select_sequence menu is then
    displayed allowing the user to choose a sequence. When the user
    presses a selection, this routine is called. The variable,
    lastSeqFun, represents the sequence function chosen by
    the user prior to pressing the sequence selection.
       The input parameter "num" represents which sequence
    was selected. 1 through max_seq_num-1 are sequences that reside
    in allocatable memory while sequence max_seq_num resides in
    CMOS (long-term) memory.

******************************************************************************
;
PROCEDURE sel_seq( num );
  VALUE num; INTEGER num;                                         ENTRY;
  BEGIN
    BOOLEAN new_alloc;
    INTEGER POINTER iptr;
    INTEGER POINTER from_ptr,to_ptr;
    INTEGER i;
    DOUBLE seq_addr;
    ALPHA seq_str;
    BYTE POINTER sptr = seq_str;
    BYTE ARRAY seqstr [-1:title_size];

IF lastSeqFun = do_seq THEN
    BEGIN
        IF mod_seq_num = 0 THEN
        BEGIN   & do sequence if no other sequence is being modified &
            IF seq_empty(num) THEN
                warn (empty_seq)
            ELSE
                & tell doSequ process to run specified sequence &
                wrt_ff (seq_ff, num);
        END;
```

```
END

ELSE IF lastSeqFun = mod_seq THEN
    BEGIN
        IF mod_seq_num <> 0 THEN
            warn (not_ok_for_seq)    & don't allow mod if already modifying&
        ELSE
        BEGIN
            rem_menu := 0;
            mod_seq_num := num;
                & allocate memory &
            IF num = max_seq_num THEN
            BEGIN
                seq_act_addr := ADRS(cmosSeq);
                STPNTR (iptr , seq_act_addr);
                new_alloc := iptr[0] <> Cseq_start;
            END
            ELSE
                new_alloc:=mem_stolen(seq_act_addr,seq_id_1+num-1,seq_size);
            IF seq_act_addr <> 0 THEN
            BEGIN   & there is memory available for the sequence &
                    & if a "paused" sequence is being modified then &
                    & set the pause_seq_num to zero to prevent &
                    & the sequence from being continued    &
                IF mod_seq_num = pause_seq_num THEN
                    pause_seq_num := 0;
                STPNTR (iptr, seq_act_addr);

IF NOT new_alloc THEN
                BEGIN
                        & look for Cseq_start and Cseq_stop tokens in list &
                        & If not in list then assume new memory alloc. &
                    IF iptr[0] <> Cseq_start THEN
                        new_alloc := TRUE
                    ELSE
                    BEGIN  & also look for Cseq_stop &
                        new_alloc := TRUE;
                        FOR i := 1 TO max_seq_entry DO
                            IF iptr[i] = Cseq_stop THEN new_alloc := FALSE;
                    END;
                END;
                IF new_alloc THEN   & clear out sequence memory &
                BEGIN
                    FOR i := 0 TO max_seq_entry DO iptr[i] := -1;
                        & write sequence boundary markers &
                    iptr[0] := Cseq_start;
                    iptr[1] := Cseq_stop;
                END;
                seq_entry := 1;
                seqMsg;   & display seq list and instructions &
            END
            ELSE
                warn (no_seq_mem);   & no memory for sequence &
        END;
        gen_menu (prior_menu);
    END ELSE IF lastSeqFun = print_seq THEN
    BEGIN
        askForCont (pr_seq1+num-1);
    END
```

```
ELSE IF lastSeqFun = titl_seq THEN
BEGIN
    IF mod_seq_num = num THEN
        & can't change title of sequence being currently modified &
        warn (not_ok_for_seq)
    ELSE
    BEGIN
        gen_menu (TITLE_MENU);
        title_seq;
        sp_prior_menu := MORE_SEQ_MENU;
    END;
END ELSE IF lastSeqFun = clr_seq THEN
BEGIN
    IF mod_seq_num = num THEN
        warn (not_ok_for_seq)   & don't clear if modifying sequence &
    ELSE IF doing_seq_num = num THEN
    BEGIN
        & don't clear running sequence &
    END
    ELSE
    BEGIN
            & if a "paused" sequence is being cleared then &
            & set the pause_seq_num to zero to prevent &
            & the sequence from being continued    &
        IF num = pause_seq_num THEN
            pause_seq_num := 0;
        p_seq_title (num);   & clear sequence title &
            & deallocate mem &
        IF num = max_seq_num THEN
        BEGIN  & clear out first 4 words in cmos memory sequence &
            STPNTR (iptr, ADRS(cmosSeq));
            iptr[0] := Cnull;
            iptr[1] := Cnull;
            iptr[2] := Cnull;
            iptr[3] := Cnull;
        END
        ELSE
            release_mem (seq_id_1+num-1);
        gen_menu (present_menu);
        beepDone;
    END;
END ELSE IF lastSeqFun = dup_seq THEN
BEGIN
        & dup source sequence has been selected, now &
        & ask user to select dup destination sequence &
    dup_from_num := num;
    lastSeqFun := dup2_seq;
    gen_menu (SELECT_SEQ_MENU2);
    tell (dup_to);
END ELSE IF lastSeqFun = dup2_seq THEN
BEGIN   & transfer contents from one sequnce to another &
        & the sequence number in dup_from_num is copied &
        & into the sequence number in num &
    IF dup_from_num < 1 OR dup_from_num > max_seq_num THEN
        dup_from_num := 1;
    IF num <> mod_seq_num AND num <> doing_seq_num THEN
    BEGIN
        IF dup_from_num <> num THEN
        BEGIN
            & determine if space is available for to-sequence &
```

```
            IF num = max_seq_num THEN
                seq_addr := ADRS(cmosSeq)
            ELSE
                mem_stolen (seq_addr,seq_id_1+num-1,seq_size);
            IF seq_addr <> 0 THEN
            BEGIN   & continue if memory is available to dup into &
                STPNTR (to_ptr, seq_addr);
                    & find starting address of from-sequence &
                IF dup_from_num = max_seq_num THEN
                    seq_addr := ADRS(cmosSeq)
                ELSE
                    seq_addr := mem_id_addr[seq_id_1+dup_from_num-1];
                STPNTR (from_ptr, seq_addr);
                    & transfer tokens from one sequence to another &
                FOR i := 0 TO max_seq_entry DO
                    to_ptr[i] := from_ptr[i];
                IF num = pause_seq_num THEN
                BEGIN   & abort a paused sequence &
                    pause_seq_num := 0;
                END;
            END
            ELSE
                warn (no_seq_mem);
        END;
    END
    ELSE    & can't duplicate into a running or modifying seq &
        warn (no_dup);
    gen_menu (sp_prior_menu);
END;

IF lastSeqFun <> titl_seq AND lastSeqFun <> dup2_seq THEN
    gen_menu (sp_prior_menu);
END sel_seq;

#EJECT;
COMMENT                                                            do_item
**************************************************************************

Execute the sequence item pointed to by the parameter
        item_indx and then increment item_indx to the next item.
        Normally the item will be a simple token that
        is sent to the command process via the token fifo.
        In the case of an active function number (token = Cfunc_num)
        the number is deposited in the entry number array. In the
        case of sequence branching tokens, the condition is first
        checked. If the condition is true then the new sequence number
        is deposited in the sequence fifo and the item_indx is set
        to the end of the current sequence. If the condition is
        false, then the nothing is executed and the item_indx is
        set to the item following the sequence branch and sequence
        number token.
           In the case of pause/continue, the active sequence number and
        sequence item index are saved and then the item index is
        set to the end of the sequence.
           All tokens sent to the command process have the seq_tok
        bits set. Sequence tokens are intended to act exactly like
        HP-IB mnemonics.

CAUTION:   item_indx is passed by REFERENCE not by VALUE.

**************************************************************************
;
PROCEDURE do_item (item_indx);
    INTEGER item_indx;
BEGIN
    INTEGER POINTER iptr;
```

```
    BYTE POINTER bptr;
    INTEGER token;
    INTEGER byte_indx, i, dummy, item_indx2;

STPNTR (iptr, seq_act_addr);
    token := iptr[item_indx];

IF token = Cfunc_num THEN
    BEGIN     & active function number in list &
       item_indx2 := item_indx + 1;  & set index to start of number &
       acquire (entry_string); & don't let anyone else use entry string&
       & transfer number from list to entry string &
       STPNTR (bptr, seq_act_addr);
       byte_indx := 2 * item_indx2;
       FOR i := 0 TO bptr[byte_indx] DO
          e_ary[i] := bptr[byte_indx+i];
       IF e_ary[bptr[byte_indx]] = pad_char THEN
          e_ary[0] := e_ary[0] - 1;  & remove pad character &
       item_indx2 := item_indx2 + (bptr[byte_indx]+1)/2;
       & send terminator token to command process &
       wrt_ff( token_ff, iptr[item_indx2] OR seq_tok  );

& wait for number to be deposited in active function &
       wait (entry_string_ready);
       release (entry_string);
       WHILE NOT empty_ff(token_ff) DO dropPriority;

& wait here if a WAIT x preceded the active function number &
       item_indx2 := item_indx;
       goto_prev_item (dummy, item_indx2);
       IF iptr[item_indx2] = Cseq_wai THEN
       BEGIN
           & a wt_time is in seconds, &
           & but pause wants a parameter in 100 msec increments &
           pause (INTEGER (10*wait_timer));
       END;
    END ELSE IF token = Ctitl_str THEN
    BEGIN    & title string in list &
       WHILE NOT empty_ff(token_ff) DO dropPriority;
       item_indx2 := item_indx + 1;   & set index to start of title &
       & transfer title from list to title array &
       STPNTR (bptr, seq_act_addr);
       byte_indx := 2 * item_indx2;
       FOR i := 0 TO bptr[byte_indx] DO
           title_ary[i] := bptr[byte_indx+i];
       IF title_ary[bptr[byte_indx]] = pad_char THEN
           title_ary[0] := title_ary[0] - 1;  & remove pad character &
       &  send title done token to command process &
       wrt_ff( token_ff, Ctitle_done OR seq_tok  );
       WHILE NOT empty_ff(token_ff) DO dropPriority;
    END ELSE IF token = CdoSequ THEN
    BEGIN    & Do a sequence &
       goto_next_item (dummy, item_indx); & go to sequence number token &
       token := iptr[item_indx];
          & translate sequence number token to a sequence number &
       i := token-Cseq_1+1;
          & send seq. number to sequence fifo if not modifying seq. &
       IF mod_seq_num=0 THEN wrt_ff (seq_ff, i);
          & exit this sequence by forcing item_indx &
          & to point to the end of the sequence &
       i := item_indx;
       WHILE iptr[i] <> Cseq_stop DO i := i + 1;
       item_indx := i;
```

```
END

ELSE IF    & Sequence Branching Tokens &
           & limit test pass &
   (token=Cseq_limp AND NOT limit_fail[curr_e_ch]) OR
           & limit test fail &
   (token=Cseq_limf AND limit_fail[curr_e_ch]) OR
           & loop counter = 0 &
   (token=Cseq_lpcz AND loop_cntr=0) OR
           & loop counter <> 0 &
   (token=Cseq_lpcnz AND loop_cntr<>0) THEN
BEGIN    & branch to another sequence &
   goto_next_item (dummy, item_indx);  & go to sequence number token &
   token := iptr[item_indx];
      & translate sequence number token to a sequence number &
   i := token-Cseq_1+1;
      & send seq. number to sequence fifo if not modifying seq. &
   IF mod_seq_num=0 THEN wrt_ff (seq_ff, i);
      & exit this sequence by forcing item_indx &
      & to point to the end of the sequence &
   i := item_indx;
   WHILE iptr[i] <> Cseq_stop DO i := i + 1;
   item_indx := i;
END ELSE IF token = Cpause_cont AND mod_seq_num = 0 THEN
BEGIN   & pause if a sequence is not being modified &
   goto_next_item (dummy, item_indx);
      & save active sequence number and sequence index &
      & so continue key will know where to start up in sequence &
   pause_seq_num := doing_seq_num;
   pause_item_indx := item_indx;

& exit this sequence by forcing item_indx &
      & to point to the end of the sequence &
   i := item_indx;
   WHILE iptr[i] <> Cseq_stop DO i := i + 1;
   item_indx := i;
      & display SEQUENCE PAUSED message in doSequ process &
END & Channel Select &
ELSE IF token= Cch1 OR token= Cch2 THEN
BEGIN
   IF (mod_seq_num = 0) THEN wait_both;
   WHILE NOT empty_ff(token_ff) DO dropPriority;
   wrt_ff (token_ff, token OR seq_tok);
   WHILE NOT empty_ff(token_ff) DO dropPriority;
   IF (mod_seq_num = 0) THEN wait_both; & wait for change to finish &
END & Recall Preset State &
ELSE IF token= Crcl_psta THEN
BEGIN
   IF (mod_seq_num = 0) THEN
   BEGIN
      wait_both;
      hpibCmd := TRUE;
   END
   ELSE
      hpibCmd := FALSE;
   recall_preset_state;
   IF (mod_seq_num = 0) THEN wait_both; & wait for change to finish &
END
```

```
                & Recall &
     ELSE IF (token>=Crecall_1  AND
              token<=Crecall_1+4) THEN
     BEGIN
         wrt_ff( token_ff, token OR seq_tok );  & send token &
         IF (mod_seq_num = 0) THEN wait_both;  &wait for recall to finish &
         WHILE NOT empty_ff(token_ff) DO dropPriority;
     END & Special processing for activities that use HP-IB &
     ELSE IF token=Cplot_all          & plot &
        OR token=Cpr_all              & print &
        OR (token>=Csave_ext1 AND     & store file &
           token<=Csave_ext1+4)
        OR (token>=Crecall_ext1 AND   & recall file &
           token<=Crecall_ext1+4)
        OR (token>=Cst_seq1 AND       & store sequence &
           token<=Cst_seq1+max_seq_num-1)
        OR (token>=Cld_seq1 AND       & load sequence &
           token<=Cld_seq1+max_seq_num-1)
        OR token= Ctit_pmtr        & title to HP-IB &
        OR token= Crecrt           & read file titles &
        OR token= Crecsqt          & read sequence titles &
        OR token= Ctit_pri  THEN   & title to printer &
     BEGIN   & plot, print or HP-IB activity &
            & send token to command process &
         wrt_ff( token_ff, token OR seq_tok );
            & wait for HP-IB activity to finish &
         wait (serv_ib_done);
            & set remote back on because HP-IB activity turns it off &
         IF doing_seq_num<>0 THEN
         BEGIN
             remote := TRUE;
             wrt_fp (fp_disable_preset);  & disable preset key &
         END;
     END ELSE       & normal token in list &
     BEGIN
         & send token to command process &
         wrt_ff (token_ff, token OR seq_tok);
     END;

goto_next_item (dummy, item_indx);

IF iptr[item_indx]= Cboolean0 OR iptr[item_indx]= Cboolean1 THEN
     BEGIN   & if on/off is next token then also do that token &
         wrt_ff( token_ff, iptr[item_indx] OR seq_tok );
         goto_next_item (dummy, item_indx);
     END;

preempt;   & allow token to complete its action &

END do_item;
#EJECT;
COMMENT                                              deposit_act_fun
****************************************************************

Take the active function string in the entry array and
     deposit it in the sequence memory. The parameter item_indx
     is the offset from the start of current sequence memory
     where active function number is placed. The parameter token
     is the terminator token associated with the number.
     The active function number starts and ends with the
     Cfunc_num token.
```

When this routine returns, the item_indx will be pointing
to the last Cfunc_num token of the active function entry
(item_indx is passed by reference).

Structure of the active function number in the sequence memory:
    Token of function needing a number (e.g. Start,Stop)
    Cfunc_num token
    Length Byte (number of digit bytes in number)
    Digit byte 1
    Digit byte 2
       *
       *
    Digit byte n
    Pad character (needed if number of digit bytes is even)
    Terminator token (x1, k, M, G)
    Cfunc_num token

```
**********************************************************************
;
PROCEDURE deposit_act_fun(item_indx,token);
   INTEGER item_indx,token;
BEGIN
   INTEGER POINTER iptr;
   BYTE POINTER act_fun_ptr;
   INTEGER i,e_indx;

STPNTR (iptr, seq_act_addr);
      & mark start of active func num&
   iptr[item_indx] := Cfunc_num;
   item_indx := item_indx + 1;
   STPNTR (act_fun_ptr, seq_act_addr + (item_indx*2) );

& get string from entry (e_ary) &
   e_indx := 0;
   FOR i := 0 TO e_ary[0] DO
   BEGIN
      act_fun_ptr[i] := e_ary[i];
         & keep track of where exponent letter was detected &
      IF e_ary[i] ='E OR e_ary[i] ='e THEN e_indx := i;
   END;

& change the value of token based on exponent in e_ary &
   IF e_indx <> 0 THEN
   BEGIN
      act_fun_ptr[0] := e_indx-1;   & strip off exponent &
      IF token = C_enter THEN
      BEGIN
         IF      e_ary[e_ary[0]] = '3 THEN token := Cunit2
         ELSE IF e_ary[e_ary[0]] = '6 THEN token := Cunit3
         ELSE IF e_ary[e_ary[0]] = '9 THEN token := Cunit4;
      END;
   END;

& If number of characters is even &
   IF NOT TBIT(act_fun_ptr[0],0) THEN
   BEGIN
      & active function number must have even number of bytes &
      & including the length byte &
      act_fun_ptr[0] := act_fun_ptr[0] + 1;
      act_fun_ptr[act_fun_ptr[0]] := pad_char;
   END;

item_indx := item_indx + (act_fun_ptr[0]+1)/2;
   iptr[item_indx] := token;   & deposit terminator &
   item_indx := item_indx + 1;
      & mark end of active func num&
```

```
        iptr[item_indx] := Cfunc_num;
    END  deposit_act_fun ;
#EJECT;
COMMENT                                                              deposit_titl_str
*****************************************************************************

Take the title string in the title array and
        deposit it in the sequence memory. The parameter item_indx
        is the offset from the start of current sequence memory
        where title string is placed.
        The title string starts and ends with the Ctitl_str token.
          When this routine returns, the item_indx will be pointing
        to the last Ctitl_str token of the title entry.
        (item_indx is passed by reference).

Structure of the active function number in the sequence memory:
            Ctitle token
            Ctitl_str token
            Length Byte (number of characters in title)
            Character 1
            Character 2
                *
                *
            Character n
            Pad character (needed if number of characters is even)
            Ctitl_str token

*****************************************************************************
;
PROCEDURE deposit_titl_str(item_indx);
    INTEGER item_indx;
BEGIN
    INTEGER POINTER iptr;
    BYTE POINTER title_ptr;
    INTEGER i;

STPNTR (iptr, seq_act_addr);
       & mark start of title &
    iptr[item_indx] := Ctitl_str;
    item_indx := item_indx + 1;
    STPNTR (title_ptr, seq_act_addr + (item_indx*2) );

& get string from title array (title_ary) &
    title_ptr[0] := title_ary[0];
    FOR i := 1 TO title_ptr[0] DO
        title_ptr[i] := title_ary[i];

& If number of characters is even &
    IF NOT TBIT(title_ptr[0],0) THEN
    BEGIN
       & title string must have even number of bytes &
       & including the length byte &
       title_ptr[0] := title_ptr[0] + 1;
       title_ptr[title_ptr[0]] := pad_char;
    END;

item_indx := item_indx + (title_ptr[0]+1)/2;
       & mark end of title &
    iptr[item_indx] := Ctitl_str;

& rewrite the main title but expand special characters &
    expandTitle (title,TRUE);
    print_str(title, title_size, title_display_bl[curr_e_ch]);
END  deposit_titl_str ;
```

EJECT; token_is_ok
COMMENT
*********************************************************************

This routine checks if the passed token can be inserted
into the sequence list. If it can then TRUE is returned
else FALSE is returned.
    In general this routine does not allow menu only keys
to be used in sequences. If the user has pressed the
REMEMBER MENU key then those menu only keys are plced    aced
into the sequence until a hard key is pressed. This way
the REMEMBER MENU feature is automatic and does not need
to be on ON/OFF key. This routine also has the responsiblity
of determining when the remember menu flag should
be turned off (for now, after two hard keys have been
pressed, turn off the flag).

*********************************************************************
;
BOOLEAN PROCEDURE token_is_ok( token );
    VALUE token; INTEGER token;
BEGIN
    BOOLEAN token_not_ok;
    BYTE POINTER ptr1;
    DOUBLE POINTER ptr2;

COMMENT
      The rem_menu flag not only indicates if menu key
      can be read into sequences but it also counts the
      number of hard keys pressed.
      ;
    IF rem_menu <> 0 THEN
    BEGIN
        IF token>=Csave AND token<=Csys_menu THEN
            rem_menu := rem_menu + 1;
              & clear flag if two hard keys have been pressed &
        IF rem_menu > 2 THEN rem_menu := 0;
    END;

& check for these keys regardless of rem_menu &
    token_not_ok :=
        token = 0
    OR token = Cup
    OR token = Chpib_talk
    OR token = Cdown
    OR token = Chpib_tct
    OR token = Cillegal
    OR token = Centry_off
    OR token = Cout_of_range
    OR token = Cpri_seq          & print sequence &
    OR (token >= Csel_let AND token <= Csel_loopcnt+4 )   & title keys &
    OR (token >= Ckey_1 AND token <= Ckey_8 );

IF token = Cmarker_menu OR token = Cmkr_function THEN
        token_not_ok := FALSE;
    IF rem_menu = 0 THEN
    BEGIN
        token_not_ok := token_not_ok
        OR token = Cparam_menu
        OR token = Cmkr_zero+1       & MARKER MODE MENU &
        OR token = Cr+2              & S PARAMETERS key &
        OR token = Cr+1              & CONVERSION key &
        OR token = Caux+3            & INPUT PORTS key &
        OR token = Caux+2            & CONVERSION  key &
        OR token = Cplot_all+1       & SELECT QUADRANT menu &
        OR token = Cplot_all+2       & DEFINE PLOT menu &
        OR token = Cplot_all+3;      & CONFIGURE PLOT menu &

```
token_not_ok := token_not_ok
OR token = Cformat_menu
OR token = Ct_add+2           & LIMIT TYPE MENU &
OR token = Cresponse_menu
OR token = Cstimulus_menu
OR token = Cmkr_sea
OR token = Ccal_menu
OR token = Crcl_psta+1        & LOAD FROM DISC &
OR token = CIB_passcont+1     & SET ADDRESSES &
OR token = CdispMenu;

token_not_ok := token_not_ok
OR token = Csys_menu
OR token = Ccopy
OR token = Clocal
OR token = Csave_5+1          & CLEAR REGISTER &
OR token = Csave_5+2          & TITLE REGISTER &
OR token = Csave_5+3          & STORE TO DISC  &
OR token = Crecall
OR token = Csave;

token_not_ok := token_not_ok
OR token = Creturn
OR token = Ctit_pri-1         & DECISION MAKING &
OR (token >= Csel_let AND token <= Csel_loopcnt )
OR (token > Cdoubler AND token <= Cseq_6 );

COMMENT
     If a select sequence key has been pressed in association
     with a sequence branch function (e.g. IF LIMIT PASS)
     or Do Sequence or Clear Sequence
     then allow the select sequence token to be entered
     into the sequence.    ;
IF (token >= Cseq_1 AND token <= Cseq_6)
   AND (lastSeqFun = bra_seq OR lastSeqFun = do_seq
                             OR lastSeqFun = clr_seq) THEN
    token_not_ok := FALSE;
  & Allow DO SEQUENCE token to be entered &
  IF token = CdoSequ THEN
    token_not_ok := FALSE;

& don't allow MORE,RETURN or MENU keys &
IF (token > 0 AND token < Cmkrval) THEN
   BEGIN
        & get first line of soft key label &
     STPNTR (ptr2,ADRS(SK_LABEL[LBL_INDEX[(token-1)*2]]));
     STPNTR (ptr1, ptr2);
     IF ptr1[1]='M AND ptr1[2]='O AND ptr1[3]='R AND ptr1[4]='E
        THEN token_not_ok := TRUE;
     IF    ptr1[1]='R AND ptr1[2]='E AND ptr1[3]='T
       AND ptr1[4]='U AND ptr1[5]='R AND ptr1[6]='N THEN
         token_not_ok := TRUE;

& get second line of soft key label &
     STPNTR (ptr2,ADRS(SK_LABEL[LBL_INDEX[((token-1)*2)+1]]));
     STPNTR (ptr1, ptr2);
     IF ptr1[1]='M AND ptr1[2]='E AND ptr1[3]='N AND ptr1[4]='U
         THEN token_not_ok := TRUE;
   END;
 END;

token_is_ok := NOT token_not_ok;
END token_is_ok;
```

```
#EJECT;                                                        seq_eat_token
COMMENT
****************************************************************
       Read in a command token and decide what to do with it:
       deposit token in sequence list, remove token from list,
       scroll list up or down.
          After something has been done with the token, the sequence
       process displays a portion of the sequence list on the CRT
       in the form of soft key labels.
          The sequence list is composed of command tokens and
       numbers for active functions. The active function numbers
       are surrounded by the token Cfunc_num. An empty slot contains
       a -1. The first token in the list is Cseq_start.
       The last token in the list is Cseq_stop.
          Call this routine with token set to 0 in order
       to refresh the sequence display list.

****************************************************************
;
PROCEDURE seq_eat_token( token );
  VALUE token; INTEGER token;                                    ENTRY;
  BEGIN
     INTEGER POINTER iptr;
     INTEGER i,dummy,i_delta;
     BYTE POINTER act_fun_ptr;
     BYTE btoken, btemp;

IF mod_seq_num <> 0 THEN
     BEGIN   & continue if a sequence is being modified &
        STPNTR (iptr, seq_act_addr);

& scroll up or down sequence list display &
        IF token = Cup OR token = Cdown THEN
           wrt_ff (seq_ff, token)

& remove a token from the sequence &
        ELSE IF token = backspace_token THEN
        BEGIN
           i := seq_entry;
           IF iptr[i-1]=Cboolean0 OR iptr[i-1]=Cboolean1 THEN
           BEGIN   & ON or OFF token and previous token are removed &
              goto_prev_item (dummy, i);
              goto_prev_item (dummy, i);
              i_delta := seq_entry - i;
           END
           ELSE
           BEGIN   & token without associated ON or OFF is removed &
              goto_prev_item (dummy, i);
              i_delta := seq_entry - i;
           END;
           IF iptr[i] <> Cseq_start THEN
           BEGIN
              seq_entry := i;
              i := i - 1;
           WHILE iptr[i] <> Cseq_stop DO
           BEGIN
              i := i + 1;
              iptr[i] := iptr[i+i_delta];
           END;
        END;
     &  goto_next_item (dummy, seq_entry);   &
     &  IF iptr[seq_entry]=Cboolean0 OR iptr[seq_entry]=Cboolean1 THEN&
     &     seq_entry := seq_entry + 1;   &
        & print the updated sequence list &
```

```
      disp_seq_list(seq_entry);
END

& add an active function number to the sequence &
ELSE IF token >= C_enter AND token <= Cunit6 THEN
BEGIN
      & calculate number of integers needed for func number &
      i := 1;
      WHILE i <= e_ary[0] AND
          e_ary[i] <> 'E AND e_ary[i] <> 'e DO i := i + 1;
      IF TBIT(i,0) THEN i := i+1;   & add pad char if needed &
      & i_delta contains #of integers in active func number &
      & and associated sequence tokens ( Cfunc_num(2), terminator) &
      i_delta := i/2 + 3;
      IF (seq_entry + i_delta) < max_seq_entry THEN
      BEGIN
          & continue if sequence memory not full &
          IF iptr[seq_entry] = Cseq_stop THEN
          BEGIN
              & active function number will be deposited &
              & at the end of the sequence &
              deposit_act_fun (seq_entry, token);
              seq_entry := seq_entry + 1;
              iptr[seq_entry] := Cseq_stop;
          END
          ELSE
          BEGIN  & open a slot in the sequence memory &
              & find the end of the sequence list &
              i := seq_entry;
              WHILE iptr[i] <> Cseq_stop DO i := i + 1;
              IF (i + i_delta) < max_seq_entry THEN
              BEGIN  & continue if there is available space &
                  & bump down each element to create an empty slot &
                  WHILE i >= seq_entry DO
                  BEGIN
                      iptr[i+i_delta] := iptr[i];
                      i := i - 1;
                  END;
                  & deposit active function number in slot &
                  deposit_act_fun (seq_entry, token);
                  seq_entry := seq_entry + 1;
              END;
          END;
          & print the updated sequence list &
          disp_seq_list(seq_entry);
      END;
      & ELSE   don't warn that memory is full because &
      &        there is room for normal integer tokens &
END
      & add a title string to the sequence &
ELSE IF token = Ctitle_done THEN
BEGIN
      & if null title then place one blank in it &
      IF title_ary[0]=0 THEN app_ch (title," ");
      & calculate number of integers needed for title string &
      i := title_ary[0] + 1;
      IF TBIT(i,0) THEN i := i+1;  & add pad char if needed &
      & i_delta contains #of integers in title string &
      & and associated sequence tokens; Ctitl_str(2) &
      i_delta := i/2 + 2;
      IF (seq_entry + i_delta) < max_seq_entry THEN
      BEGIN
          & continue if sequence memory not full &
          IF iptr[seq_entry] = Cseq_stop THEN
          BEGIN
              & title string will be deposited &
```

```
                & at the end of the sequence &
                deposit_titl_str (seq_entry);
                seq_entry := seq_entry + 1;
                iptr[seq_entry] := Cseq_stop;
            END
            ELSE
            BEGIN   & open a slot in the sequence memory &
                    & find the end of the sequence list &
                i := seq_entry;
                WHILE iptr[i] <> Cseq_stop DO i := i + 1;
                IF (i + i_delta) < max_seq_entry THEN
                BEGIN   & continue if there is available space &
                        & bump down each element to create an empty slot &
                    WHILE i >= seq_entry DO
                    BEGIN
                        iptr[i+i_delta] := iptr[i];
                        i := i - 1;
                    END;
                        & deposit title string in slot &
                    deposit_titl_str (seq_entry);
                    seq_entry := seq_entry + 1;
                END;
            END;
                & print the updated sequence list &
            disp_seq_list(seq_entry);
        END;
        & ELSE   don't warn that memory is full because &
        &        there is room for normal integer tokens &
    END & RPG scrolls up or down sequence list display &
        & except during a title or label active function &
    ELSE IF TBIT (token, rpg_bit) AND NOT title_actf THEN
    BEGIN
    btoken := BYTE (token);   & examine only the 8 LS bytes &
    btoken := btoken/2;
    IF btoken < -1 THEN
    BEGIN
        IF NOT full_ff (seq_ff) THEN wrt_ff (seq_ff, Cdown);
    END
    ELSE IF btoken > 1 THEN
    BEGIN
        IF NOT full_ff (seq_ff) THEN wrt_ff (seq_ff, Cup);
    END;
END & add a token to the sequence &
ELSE IF seq_entry < max_seq_entry AND token_is_ok(token) THEN
BEGIN
    & continue if sequence memory not full &
    & and if token is reasonable &
    IF iptr[seq_entry] = Cseq_stop THEN
    BEGIN   & if slot in seq memory is empty then deposit token &
        iptr[seq_entry] := token;
        seq_entry := seq_entry + 1;
        iptr[seq_entry] := Cseq_stop;
    END
    ELSE
    BEGIN   & open a slot in the sequence memory &
            & find the end of the sequence list &
        i := seq_entry;
        WHILE iptr[i] <> Cseq_stop DO i := i + 1;
        i := i + 1;
        IF i <= max_seq_entry THEN
        BEGIN   & continue if there is available space &
```

```
                    & bump down each element to create an empty slot &
                    WHILE i > seq_entry DO
                    BEGIN
                        iptr[i] := iptr[i-1];
                        i := i - 1;
                    END;
                    iptr[seq_entry] := token;  & deposit token in slot &
                    seq_entry := seq_entry + 1;
                END
                ELSE
                    warn (seq_mem_full);
            END;
            & print the updated sequence list &
            disp_seq_list(seq_entry);
        END & refresh sequence list if token=0 &
        ELSE IF token=0 THEN disp_seq_list (seq_entry)

& sequence memory is full &
        ELSE IF seq_entry >= max_seq_entry THEN
            warn (seq_mem_full);

END;
    END seq_eat_token;
#EJECT;
COMMENT                                                              doSequ
*****************************************************************************
*                                                                           *
*                                                                           *
* FUNCTION: to feed sequence list items to the command process.
    The feeding can occur either when the "DO SEQUENCE"
    key is pressed or while the user is modifying a
    sequence and is stepping forwards or backwards through
    a sequence.

This process is activated when the command process sends
    a signal via the seq_ff fifo. The signals tell the process
    to execute a particular sequence or to step up or down through
    the active sequence.
*                                                                           *
*****************************************************************************
*                                                                           *
*   Normal points of suspension:                                            *
        read sequence fifo
        acquire entry string   ( inside do_item )
        wait for entry_string_ready   ( inside do_item )
*                                                                           *
*                                                                           *
*****************************************************************************
;
PROCEDURE doSequ;                                                    ENTRY;
BEGIN
    INTEGER seq_token;  & signal sent from command process &
    INTEGER dummy, item_indx;
    INTEGER POINTER iptr,dgptr;
    ALPHA seq_str;
    BYTE POINTER sptr = seq_str;
    BYTE ARRAY seqstr [-1:title_size];

mod_seq_num := 0;   & no sequence is being modified &
        pause_seq_num := 0; & no sequence can be "continued" &
        doing_seq_num := 0; & no sequence is running & loop: seq_token := read_ff (seq_ff);
```

```
IF (seq_token <= max_seq_num) OR
   (seq_token = Cpause_cont AND pause_seq_num <> 0) THEN
BEGIN   & execute or resume a sequence &
    lbSeq (seq_displ,blankstr);
    lbSeq (seq_disp2,blankstr);   & clear previous seq messages &

& Assume the selected sequence contains some tokens &
    & Get the starting address of the sequence &
    IF seq_token = Cpause_cont THEN
    BEGIN
        IF pause_seq_num = max_seq_num THEN
            seq_act_addr := ADRS(cmosSeq)
        ELSE
            seq_act_addr := mem_id_addr[seq_id_1+pause_seq_num-1];
        item_indx := pause_item_indx;
        doing_seq_num := pause_seq_num;
    END
    ELSE
    BEGIN
        IF seq_token = max_seq_num THEN
            seq_act_addr := ADRS(cmosSeq)
        ELSE
            seq_act_addr := mem_id_addr[seq_id_1+seq_token-1];
        item_indx := 1;   & set pointer to first seq token &
        doing_seq_num := seq_token;
    END;
        & don't allow sequence to be continued again &
    pause_seq_num := 0;

seqMsg;   & print Doing Sequence message &
    STPNTR (iptr, seq_act_addr);
    IF iptr[0] = Cseq_start THEN
    BEGIN   & continue if start of sequence is marked &
            & lockout front panel except LOCAL &
        remote := TRUE;
        abortCmd := FALSE;
        wrt_fp (fp_disable_preset);   & disable preset key &
        COMMENT
            Do items if keyboard is locked out and not at end
            of sequence. Local key aborts a running sequence. ;
        WHILE NOT abortCmd AND (iptr[item_indx] <> Cseq_stop) DO
        BEGIN
            do_item (item_indx);
        END;
    END;

IF abortCmd THEN   & LOCAL has been pressed &
    BEGIN
            & empty out sequence and token fifos &
        WHILE NOT empty_ff (seq_ff) DO read_ff (seq_ff);
        WHILE NOT empty_ff (token_ff) DO read_ff (token_ff);
        remote := FALSE;
        tell (seq_abo);   & tell user sequence has been aborted &
    END;

& enable front panel if there are no more sequences to do &
    & or if the sequence has paused &
    IF empty_ff(seq_ff) OR pause_seq_num <> 0 THEN
    BEGIN
        remote := FALSE;
        wrt_fp (fp_enable_preset);   & enable preset key &
    END;
    lbSeq (seq_displ,blankstr);   & turn off DOING SEQUENCE msg &

IF pause_seq_num <> 0 THEN
    BEGIN   & the sequence has paused, not stopped &
```

```
            & display SEQUENCE PAUSED message &
        STPNTR (sptr, ADRS(seqstr));
        sptr[-1] := title_size;
        seqstr[0] := 0;
        app_str (seq_str ,"SEQUENCE ");
            & append the sequence title to the SEQ PAUSED string&
        app_str (seq_str, seq_title[pause_seq_num,0]);
        app_str (seq_str, " PAUSED;");
        lbSeq (seq_displ, seq_str);
        lbSeq (seq_disp2,
            "press CONTINUE SEQUENCE in SYSTEM MENU to restart");
    END;
    doing_seq_num := 0;
        & allow pending processes to run in case another &
        & sequence is going start up &
    preempt;
END & scroll up sequence list display &
ELSE IF seq_token = Cup THEN
BEGIN
    STPNTR (iptr, seq_act_addr);
    IF iptr[seq_entry] <> Cseq_stop
       AND NOT full_ff (token_ff) THEN
    BEGIN
        COMMENT  Do the next item in the sequence if we are
            not at the end of the sequence and if the token
            fifo is not full.       ;
        do_item (seq_entry);
        IF mod_seq_num<>0 AND iptr[seq_entry-1] = Ctitle THEN
        BEGIN  & wait until title string is entered before &
               & displaying sequence list &
            WHILE NOT empty_ff(token_ff) DO dropPriority;
        END;
    END
    ELSE
        & wraparound from end of list to start of list &
        seq_entry := 1;
    & print the updated sequence list &
    disp_seq_list(seq_entry);
END & scroll down sequence list display &
ELSE IF seq_token = Cdown THEN
BEGIN
    STPNTR (iptr, seq_act_addr);
    goto_prev_item (dummy, seq_entry);

IF iptr[seq_entry]=Cboolean0 OR iptr[seq_entry]=Cboolean1 THEN
        & if on/off token then skip to previous token &
        goto_prev_item (dummy, seq_entry)

ELSE IF iptr[seq_entry] = Cseq_start THEN
    BEGIN
        & wrap-around from start of list to end of list &
        & find end of sequence &
        item_indx := 1;
        WHILE iptr[item_indx] <> Cseq_stop DO
            item_indx := item_indx + 1;
        seq_entry := item_indx;
    END;
        & turn off "stray" active function &
    wrt_ff( token_ff, Centry_off OR seq_tok );
      & wait until all tokens have been executed &
    WHILE NOT empty_ff(token_ff) DO dropPriority;
```

```
        & print the updated sequence list &
        disp_seq_list(seq_entry);
    END;

GO TO loop;

END;    & doSequ &
#EJECT;
COMMENT                                                     stop_seq
*********************************************************************

Halt any sequence activity. Also empty out the sequence
    fifo and token fifo. This routine should be called when
    the local key is pressed.

*********************************************************************
;
PROCEDURE stop_seq;
BEGIN
    IF (doing_seq_num <> 0) OR (NOT empty_ff (seq_ff)) THEN
    BEGIN   & continue if a sequence is running or waiting to run &

& empty out sequencing and token fifos &
        WHILE NOT empty_ff(seq_ff) DO read_ff (seq_ff);
        WHILE NOT empty_ff(token_ff) DO read_ff (token_ff);

pause_seq_num := 0;
        doing_seq_num := 0;
        remote := FALSE;
    END;
END stop_seq;
#EJECT;
COMMENT                                                     seqTutor
*********************************************************************

Erase measurement display and write one page tutorial
    about sequencing. The tutorial is displayed when the
    MOD SEQUENCE key is pressed and disappears when any
    other key is pressed.

*********************************************************************
;
PROCEDURE seqTutor;                                         ENTRY;
BEGIN & write one line of the tutorial message and move to next line &
    PROCEDURE lbt (str);    VALUE str;    ALPHA str;
    BEGIN
        dga:=lb(dga, str );
        y_pos := y_pos - 140;
        dga := move (dga, 30, y_pos);   & go down one line &
    END;

eraseDisp (st_text); & this also allocates memory for tutorial text &
    dga := dgMemAddr [e_aux_id];
    dga := dg_wrt (dga, eod); & blank page while writing tutorial &
    y_pos := 3584;
    dga := move (dga, 30, y_pos);   & set starting x,y position & lbt( "               TEST SEQUENCING                    ");
    lbt( " ");
    lbt( "MODIFY                                            ");
    lbt( "    INSERT - Any function is inserted after cursor. ");
```

```
lbt( "       DELETE  - BACK SP deletes line at cursor.            ");
lbt( "       STEP    - Use ARROW keys or RPG. ARROW up does the   ");
lbt( "                 function at the cursor and moves list up.  ");
lbt( "                 ARROW down only moves list down.           ");
lbt( "       END     - Press DONE MODIFY in SEQUENCE MENU.        ");
lbt( " ");
lbt( " ");
lbt( "RUN                                                         ");
lbt( "       START   - Press DO SEQUENCE in SEQUENCE MENU.        ");
lbt( "       KEYS    - All front panel keys except LOCAL are      ");
lbt( "                 locked out until sequence stops.           ");
lbt( "       STOP    - Press LOCAL to stop a running sequence.    ");
lbt( "       PAUSE   - Press CONTINUE SEQUENCE in SYSTEM MENU     ");
lbt( "                 to restart a paused sequence.              ");
lbt( " ");
lbt( " ");
lbt( "Only sequence 6 is saved when instrument is turned off.");
lbt( "For more information, see Test Sequencing chapter in   ");
lbt( "System Operating And Programming Manual.               ");
lbt( " ");
lbt( "Select a softkey to start modifying a sequence-------->");
```

Test sequencing allows any available functions to be executed automatically with a single keystroke. The test sequences can be entered from the front panel, read from an external disc, or down loaded over HP-IB from an external controller.

Test sequencing allows the user to combine a series of features, such as limit testing, harmonic measurements, and marker functions, with if/then decision capabilities into a test executable by a single keystroke. Creating a test sequence is virtually identical to making a manual measurement using the front panel. Once the user enters sequencing mode, all he or she needs to do is make the desired measurement. The analyzer 12 records the keystrokes it required to do so, storing them where they can be called up and repeated with a single keystroke. Test sequences can be stored in internal registers, or on an external disc. Test sequencing also allows the user to cascade multiple sequences to increase efficiency and reduce test times when performing longer, more elaborate tests. Furthermore, test sequencing enables the user to send HP-IB output strings to automatically control external devices, such as signal generators, power supplies, or relay actuators.

FIG. 3 illustrates a screen that is presented to the user in accordance with the invention. FIG. 3 actually depicts a test sequencing CRT display generated by the vector network analyzer 12.

The major advantage of test sequencing is based on the ease of use and the fact that the measurement and sequence construction are interactive. When the "MODIFY SEQUENCE" key is depressed, the test instrument begins to record all future keystrokes. This record is displayed on the display screen along with the actual measurement. The test instrument operates normally to perform the measurement, so the user has immediate feedback as to whether or not the test sequence is proceeding as expected. There is no need for the user to memorize the test protocol and then key it in, or to do extensive debugging after the test sequence is entered. There is no looking at reference documentation or memorizing function mnemonics, since the user is not keying in instructions. He or she is just executing normal test instrument functions. Finally, there is no real way to enter something that does not work or has a syntax problem, because the user is just using built-in test instrument functions that are all available.

The test sequencing procedure in accordance with the invention will now be compared to other known test instrument automation procedures. There are several ways to automate a test instrument. One is to have a person sit in front of it and push buttons (manual automation). Another is to have a test procedure that tells that person how to push those buttons. The other extreme is to effectively have an external computer push the buttons. Test sequencing in accordance with the invention lies between the last two approaches. This is achieved by allowing an experienced person to push buttons, and then a less experienced person can operate the test instrument as though a computer was performing the work. To accomplish this requires a form of "key sequence programming." In key sequence programming, a user executes a series of keystrokes once, and then the series can be repeated with the push of one button.

There are two known types of key sequence programming. One is on computers, such as programmable calculators, which aim for a similar end result, namely, a simple way to enter programs. The other is similar to the ASP and BASIC programming, which attempts to install a full-featured BASIC like programming language into a test instrument. Test sequencing in accordance with the invention introduces a third type which provides a middle ground.

Test sequencing does not attempt to put the full features and flexibility of a BASIC programming language into a test instrument, but it does allow a very simple way to enter a series of keystrokes. The following comparison of test sequencing to other types of key sequence programming will aid an understanding of the invention.

To help explain the differences between these approaches, several examples will be described. To compare a calculator and the signal measurement system 10, an editing and debugging cycle serves as an example. For ASP or BASIC programming versus test sequencing, a measurement will be described later.

For a calculator:

Switch to program mode. (The display changes to show a line number.)

"45.2", "ENTER". (A series of codes or alphanumerics appears in the display.)

"RECALL 02". (A code appears showing recall.)

"x". (A code appears showing multiply.)

"STORE 57". (A code appears that means something different since this is not allowed.)

"R/S". (Tell program to stop.)

Switch to run mode. (Display shows usual display.)

Now, to run the program, the user accesses the start location of the program and depresses the "R/S" key. The program runs, the result appears, and the answer is displayed, although it is not what is expected. Therefore, the user enters the program and depresses "SST" repeatedly to show each program step, and when not depressing the keys, an intermediate answer appears in the display. This helps the user find that "STORE 57" is not possible, a syntax error.

For the signal measurement system 10:

A similar example is difficult, since the signal measurement system 10 is not a general purpose calculator. But a general measurement might be:

Depress "MODIFY SEQUENCE". (A one page description of test sequencing is displayed.)

Depress the sequence name to be modified. (The normal display appears, overlaid with a sequence header.)

Depress "MEASURE A/R". ("A/R" shows on the display screen in the test sequence list, and A/R, that is, the ratio of one channel input to another, is measured on the trace.)

Depress "DATA INTO MEMORY". ("Data into Memory" appears, and the data trace is stored into memory.)

Depress "DATA/MEMORY". ("Data/Memory" appears, and the trace becomes Data/Memory.)

Depress "DONE MODIFY". (The test sequence list just entered disappears, but the display is still measuring A/R with data/memory.)

Now, run the program by depressing "DO SEQUENCE". The program runs and ends. Note that there is no syntax problem because only available functions can be entered on the signal measurement system 10, so there is no way to enter a bad line. Also, the commands appearing on the display screen are exactly the same as on the softkeys (or hard keys) depressed. There is no program language to learn. Finally, the lines are executed as entered, so even though there is no way to make a syntax error, if the user depresses something that was not intended to be pressed, the user can discern from the normal display that he or she is not measuring what was expected.

For a BASIC program:

Hit "EDIT" program key. (The normal measurement display is blanked and a line number appears.)

Key in "A/R" (or in some test instruments, hit an "A/R" key). (The command for A/R appears, for example, "measar".)

Key in "X1=D1". (This is just what appears on the display. It means put the data into some variable X.)

Key in "disp=X1*Y1/5.3". (This is what appears; it does a mathematical operation on the data in the X and Y variable arrays.)

Key in "END". (This appears on the display screen.)

Press "DONE EDIT". (The normal measurement display appears.)

Now, to run the program, the user finds the RUN program key and depresses it. Invariably, the result is "SYNTAX ERROR ON LINE 30". The user then repeats the series of commands shown above. He or she enters "EDIT", finds line 30, and retypes that line to correct it. Then he or she exits the edit mode and runs the program again.

The differences between this and test sequencing are similar to the differences described in connection with the calculator example. The user never has to leave the normal measurement display (and thus the measurement) to enter a test sequence, and the user cannot have syntax problems.

The signal measurement system 10 directly performs simple measurements on devices, including magnitude, phase, or group delay, on two channels. The user can also perform marker search and read out for maximum and minimums. Test sequencing allows any of these types of features to be strung together in a sequence.

The signal measurement system 10 incorporates an approach that allows a user to create a program as a sequence of keystrokes while performing an actual measurement. This allows someone with no knowledge or training with sequencing of test steps to be able to create and execute a test sequence. The test sequence can then be used to repeat measurements, or by an untrained user, with no concern about making mistakes.

The foregoing description is offered primarily for purposes of illustration. While a variety of embodiments has been disclosed, it will be readily apparent to those skilled in the art that numerous other modifications and variations not mentioned above can still be made without departing from the spirit and scope of the invention as claimed below.

What is claimed is:

1. A method for enabling a user to define a test sequence during setup of a signal measurement system, comprising the steps of:

providing a user of the signal measurement system with softkey menus for selecting a desired series of test steps, including measurement selection for a device to be tested, for combination into a test sequence for execution as a single measurement process;

measuring data using the selected test sequence;

displaying the measured data; and displaying the steps in the selected test sequence, as the steps of the test sequence are entered, as an overlay on displayed data measured using the selected test sequence.

2. The method of claim 1, further comprising the step of programming a signal processing unit included in the signal measurement with firmware to enable the user to enter the test sequence for the device to be tested by the signal measurement system for a desired test.

3. The method of claim 1, further comprising the step of providing the user of the signal measurement system with softkey menus for selecting one of a calibration measurement and a test measurement for the device to be tested.

4. The method of claim 1 wherein the signal measurement system is a vector network analyzer for measuring performance of RF and microwave systems and components.

5. The method of claim 1 wherein each softkey menu comprises a set of textual selections displayed via a user interface for prompting the user to key in the test sequence.

6. The method of claim 5 wherein the step of displaying softkey menus to the user comprises displaying software menus on a cathode ray tube incorporated in the user interface of a signal processing unit, the signal processing unit being included in the signal measurement system.

7. In a method of operation of a signal measurement system, the improvement comprising the steps of:

enabling a user of the signal measurement system to select a desired series of test steps, including measurement selection, for combination into a test sequence for execution as a single measurement process;

measuring data using the selected test sequence;

displaying the measured data; and displaying the steps in the selected test sequence, as the steps of the test sequence are entered, as an overlay on displayed data measured using the selected test sequence.

8. A signal measurement system incorporating user definition of test sequences, comprising:

a display for displaying measured data;

means for providing images on the display for enabling the user to define a test sequence during setup of the signal measurement system, the test sequence being stored for recall and execution;

means for measuring data using the defined test sequence; and means for displaying steps in the defined test sequence, as the steps of the test sequence are entered, as an overlay on displayed data measured using the defined test sequence.

9. The signal measurement system of claim 8 wherein the images comprise softkey menus and each softkey menu comprises a set of textual selections displayed by the display for prompting the user to key in the test sequence.

10. The signal measurement system of claim 8 wherein a signal processing unit included in the signal measurement system incorporates firmware to aid the user in entering a test sequence for a device to be tested by the signal measurement system for a desired test.

11. The signal measurement system of claim 8 wherein the display comprises a cathode ray tube incorporated in a signal processing unit, the signal processing unit being included in the signal measurement system.

12. The signal measurement system of claim 8, further comprising means for providing the user of the signal measurement system with softkey menus for selecting one of a calibration measurement and a test measurement for a device to be tested.

13. The signal measurement system of claim 8 wherein the signal measurement system is vector network analyzer for measuring performance of RF and microwave systems and components.

14. The signal measurement system of claim 8, further comprising means for measuring a device under test.

* * * * *